(12) United States Patent
Lee

(10) Patent No.: US 10,211,212 B2
(45) Date of Patent: Feb. 19, 2019

(54) SEMICONDUCTOR DEVICES

(71) Applicant: SAMSUNG ELECTRONICS CO., LTD., Suwon-si, Gyeonggi-Do (KR)

(72) Inventor: Inhak Lee, Daegu (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 18 days.

(21) Appl. No.: 15/701,527

(22) Filed: Sep. 12, 2017

(65) Prior Publication Data

US 2018/0151576 A1    May 31, 2018

(30) Foreign Application Priority Data

Nov. 28, 2016 (KR) .......................... 10-2016-0159586

(51) Int. Cl.
*H01L 27/112* (2006.01)
*H01L 23/522* (2006.01)

(52) U.S. Cl.
CPC .... *H01L 27/11226* (2013.01); *H01L 23/5226* (2013.01)

(58) Field of Classification Search
CPC ............. H01L 29/7848; H01L 23/5226; H01L 23/528; H01L 29/66795; H01L 29/785; H01L 21/823431; H01L 21/823821; H01L 27/0886; H01L 27/0924; H01L 27/11213; G11C 17/12; G11C 11/412
See application file for complete search history.

(56) References Cited

U.S. PATENT DOCUMENTS

| | | | |
|---|---|---|---|
| 5,959,877 A * | 9/1999 | Takahashi | ......... H01L 27/11226 257/390 |
| 6,433,384 B1 * | 8/2002 | Hashimoto | ........... H01L 27/115 257/316 |
| 7,634,744 B2 | 12/2009 | Sumimoto et al. | |
| 8,422,262 B2 | 4/2013 | Nevers et al. | |
| 8,436,405 B2 | 5/2013 | Liaw | |
| 8,750,011 B2 | 6/2014 | Liaw | |
| 9,240,221 B2 | 1/2016 | Terada et al. | |
| 19,276,108 | 3/2016 | Liaw | |
| 9,312,265 B2 | 4/2016 | Liaw | |
| 9,431,066 B1 * | 8/2016 | Chen | ........................ G11C 5/04 |

(Continued)

*Primary Examiner* — Matthew Reames
*Assistant Examiner* — John Bodnar
(74) *Attorney, Agent, or Firm* — F. Chau & Associates, LLC

(57) ABSTRACT

A semiconductor device includes a substrate having a first active region; first and second gate electrodes disposed on the first active region; first, second and third impurity regions disposed in the first active region; first, second and third active contacts disposed on and connected to the first, second and third impurity regions; a first power line electrically connected to the first impurity region through the first active contact; and a first bit line electrically connected to the second and third impurity regions through the second and third active contacts. The first gate electrode and the first and second impurity regions form a first transistor of a first memory cell. The second gate electrode and the second and third impurity regions form a second transistor of a second memory cell. The second impurity region is a drain of the first and second transistors of the first and second memory cells.

19 Claims, 34 Drawing Sheets

(56) References Cited

U.S. PATENT DOCUMENTS

| | | | |
|---|---|---|---|
| 2014/0198555 A1* | 7/2014 | Wan | G11C 17/14 |
| | | | 365/104 |
| 2014/0231921 A1* | 8/2014 | Liaw | G11C 5/06 |
| | | | 257/368 |
| 2016/0079425 A1* | 3/2016 | Xu | H01L 21/02381 |
| | | | 257/77 |
| 2017/0103917 A1* | 4/2017 | Cai | H01L 21/76897 |

* cited by examiner

SEMICONDUCTOR DEVICES

CROSS-REFERENCE TO RELATED APPLICATION

This U.S. non-provisional patent application claims priority under 35 U.S.C. § 119 to Korean Patent Application No. 10-2016-0159586 filed on Nov. 28, 2016 in the Korean Intellectual Property Office, the disclosure of which is incorporated by reference herein in its entirety.

TECHNICAL FIELD

Exemplary embodiments of the present inventive concept relate to a semiconductor device, and more particularly to a semiconductor device including a memory cell.

DISCUSSION OF RELATED ART

Semiconductor devices are ubiquitous in the electronics industry due to their small size, multi-function ability, low fabrication cost, etc. The semiconductor devices may be referred to as any semiconductor memory devices for storing logic data, semiconductor logic devices for processing operations of logic data, and hybrid semiconductor devices having both memory and logic elements. The semiconductor devices are increasingly used for highly integrated devices. This is so, because the semiconductor devices have high reliability, high speed, and/or multi-functional uses. However, as design margins shrink, the semiconductor characteristics of the devices may deteriorate.

SUMMARY

Exemplary embodiments of the present inventive concept provide a semiconductor device. The semiconductor device includes a substrate including a first active region; a first gate electrode and a second gate electrode disposed on the first active region; first, second and third impurity regions disposed in the first active region, the first impurity region adjacent to a side of the first gate electrode, the second impurity region disposed between the first and second gate electrodes, and the third impurity region adjacent to a side of the second gate electrode; first, second and third active contacts disposed on and connected to the first, second and third impurity regions, respectively; a first power line electrically connected to the first impurity region through the first active contact; and a first bit line electrically to the second and third impurity regions through the second and third contacts, respectively. The first gate electrode, the first impurity region, and the second impurity region form a first transistor of a first memory cell. The second gate electrode, the second impurity region, and the third impurity region form a second transistor of a second memory cell. The second impurity region is a drain of the first and second transistors of the first and second memory cells.

Exemplary embodiments of the present inventive concept provide a semiconductor device. The semiconductor device includes a substrate having an active pattern; a gate electrode disposed on the active pattern, the gate electrode surrounding an upper surface and opposite sidewalls of the active pattern; a first source/drain region and a second source/drain region disposed at an upper portion of the active pattern, the gate electrode disposed between the first and second source/drain regions; first and second active contacts disposed on and connected to the first and second source/drain regions, respectively; a first via disposed on the first active contact and a second via disposed on the second active contact; and a first power line and a first bit line disposed on the first and second active contacts. The active pattern and the gate electrode form a transistor of a memory cell. At least one of the first and second vias is connected to the first power line or the first bit line. The first and second source/drain regions include a semiconductor element having a lattice constant greater than a lattice constant of a semiconductor element of the substrate.

Exemplary embodiments of the present inventive concept provide a semiconductor device. The semiconductor device includes a substrate, a gate electrode, first and second active contacts, a first via, a second via, a power line, and a bit line. The substrate includes an active patter. The active pattern includes a first source/drain region, a second source/drain region and a channel region. The gate electrode is disposed on the active pattern between the first and second source/drain regions. The first and second active contacts are disposed on and connected to the first and second source/drain regions, respectively. The first via is disposed on the first active contact. The second via is disposed on the second active contact. The power line and the bit line are disposed on each of the first and second active contacts. The active pattern and the gate electrode form a transistor of a memory cell. The first and second vias are connected to the bit line. The memory cell is in an OFF-state.

DETAILED DESCRIPTION OF THE EMBODIMENTS

Figure 1:
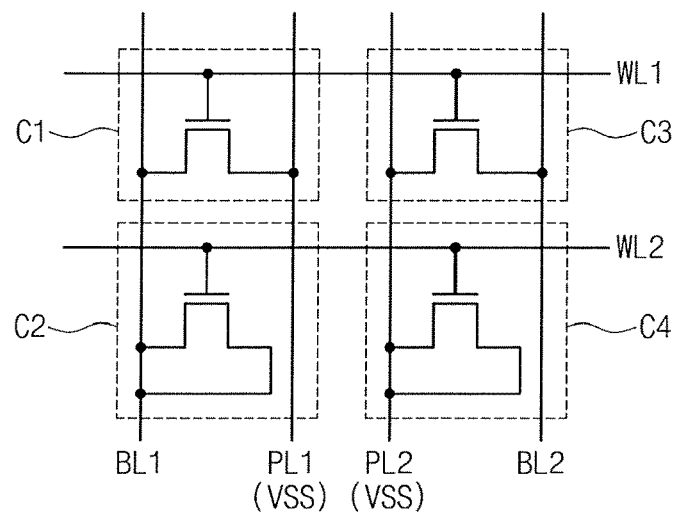
FIG. 1 is a circuit diagram illustrating memory cells of a semiconductor device according to an exemplary embodiment of the present inventive concept.

FIG. 1 is a circuit diagram illustrating memory cells of a semiconductor device according to an exemplary embodiment of the present inventive concept.

Referring to FIG. 1, a semiconductor device may include word lines WL1 and WL2, bit lines BL1 and BL2, power lines PL1 and PL2, and memory cells C1, C2, C3, and C4. The memory cells C1 to C4 may be disposed between the bit lines BL1 and BL2 and the power lines PL1 and PL2. The word lines WL1 and WL2 may include a first word line WL1 and a second word line WL2. The bit lines BL1 and BL2 may include a first bit line BL1 and a second bit line BL2. The power lines PL1 and PL2 may include a first power line PL1 and a second power line PL2. The memory cells C1 to C4 may include a first memory cell C1, a second memory cell C2, a third memory cell C3, and a fourth memory cell C4.

In an exemplary embodiment of the present inventive concept, the memory cells C1 to C4 may be Read Only Memory (ROM) cells. The ROM cells may store a bit in a logic state of "0" or "1" corresponding to whether a conductive path is present between a bit line and a power line.

In an exemplary embodiment of the present inventive concept, the first and second power lines PL1 and PL2 may be Voltage Source Source (VSS) lines. Although FIG. 1 illustrates the first and second power lines PL1 and PL2 as lines separated from each other, the first and second power lines PL1 and PL2 may be a single unitary power line.

Each of the first to fourth memory cells C1 to C4 may include a transistor. In an exemplary embodiment of the present inventive concept, the transistors of the first to fourth memory cells C1 to C4 may be a-channel metal-oxide-semiconductor field-effect transistors (NMOSFETs).

The transistor of the first memory cell C1 may include a gate electrode, a drain region, and a source region. The gate electrode may be connected to the first word line WL1. The drain region maybe connected to the first bit line BL1. The source region may be connected to the first power line PL1. When the transistor of the first memory cell C1 is turned on, a conductive path may be formed between the first bit line BL1 and the first power line PL1. Thus, when a read signal is applied to the first word line WL1, a current signal may be read out from the first bit line BL1 in response to the read signal. Accordingly, the first memory cell C1 may be in an ON-state.

The transistor of the second memory cell C2 may include a gate electrode, a source region, and a drain region. The gate electrode may be connected to the second word line WL2. The source region may be connected to the first bit line BL1. The drain region may be connected to the first bit line BL1. As the transistor of the second memory cell C2 may have the source and drain regions connected to the first bit line BL1, a conductive path might not be formed between the first bit line BL1 and the first power line PL1. Thus, when the second word line WL2 is supplied with a read signal, a current signal might not be read out from the first bit line BL1 in response to the read signal. Accordingly, the second memory cell C2 may be in an OFF-state.

The transistor of the third memory cell C3 may include a gate electrode, a drain region, and a source region. The gate electrode may be connected to the first word line WL1. The drain region may be connected to the second bit line BL2. The source region may be connected to the second power line PL2. When the transistor of the third memory cell C3 is turned on, a conductive path may be formed between the second bit line BL2 and the second power line PL2. Thus, when a read signal is applied to the second word line WL2, a current signal may be read out from the second bit line BL2 in response to the read signal. Accordingly, the third memory cell C3 may be in an ON-state.

The transistor of the fourth memory cell C4 may include a gate electrode, a source region, and a drain region. The gate electrode may be connected to the second word line WL2. The source region may be connected to the second power line PL2. The drain region may be connected to the second power line PL2. As the transistor of the fourth memory cell C4 may have the source and drain regions connected to the second power line PL2, a conductive path might not be formed between the second bit line BL2 and the second power line PL2. Thus, when the second word line WL2 is supplied with a read signal, a current signal might not be read out from the second bit line BL2 in response to the read signal. Accordingly, the fourth memory cell C4 may be in an OFF-state.

For example, the ON- and OFF-states of the memory cell may represent logic states of "1" and "0", respectively. Alternatively, the ON- and OFF-states of the memory cell may represent logic states of "0" and "1", respectively.

Figure 2:
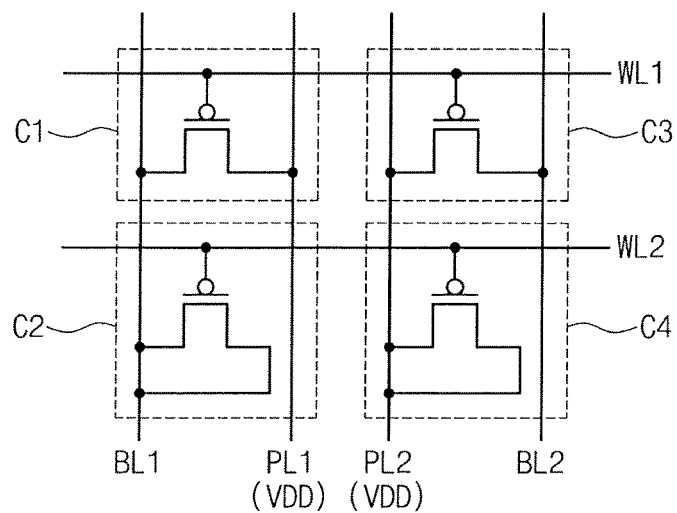
FIG. 2 is a circuit diagram illustrating memory cells of a semiconductor device according to an exemplary embodiment of the present inventive concept.

FIG. 2 is a circuit diagram illustrating memory cells of a semiconductor device according to an exemplary embodiment of the present inventive concept. A detailed description of technical features repetitive to those formerly discussed with reference to FIG. 1 may be omitted.

Referring to FIG. 2, the first and second power lines PL1 and PL2 may be Voltage Drain Drain (VDD) lines. Although FIG. 2 illustrates the first and second power lines PL1 and PL2 as lines separated from each other, the first and second power lines PL1 and PL2 may be a single unitary power line.

Each of the first to fourth memory cells C1 to C4 may include a transistor. In an exemplary embodiment of the present inventive concept, the transistors of the first to fourth memory cells C1 to C4 may be p-channel metal-oxide-semiconductor field-effect transistors (PMOSFETs).

Likewise the memory cells C1 to C4 discussed above with reference to FIG. 1, the memory cells C1 to C4 of the current embodiment may exhibit an ON- or OFF-state corresponding to whether a conductive path is present between a bit line and a power line. Accordingly, the first memory cell C1 may exhibit an ON-state, the second memory cell C2 may exhibit an OFF-state, the third memory cell C3 may exhibit an ON-state, and the fourth memory cell C4 may exhibit an OFF-state.

Figure 3:
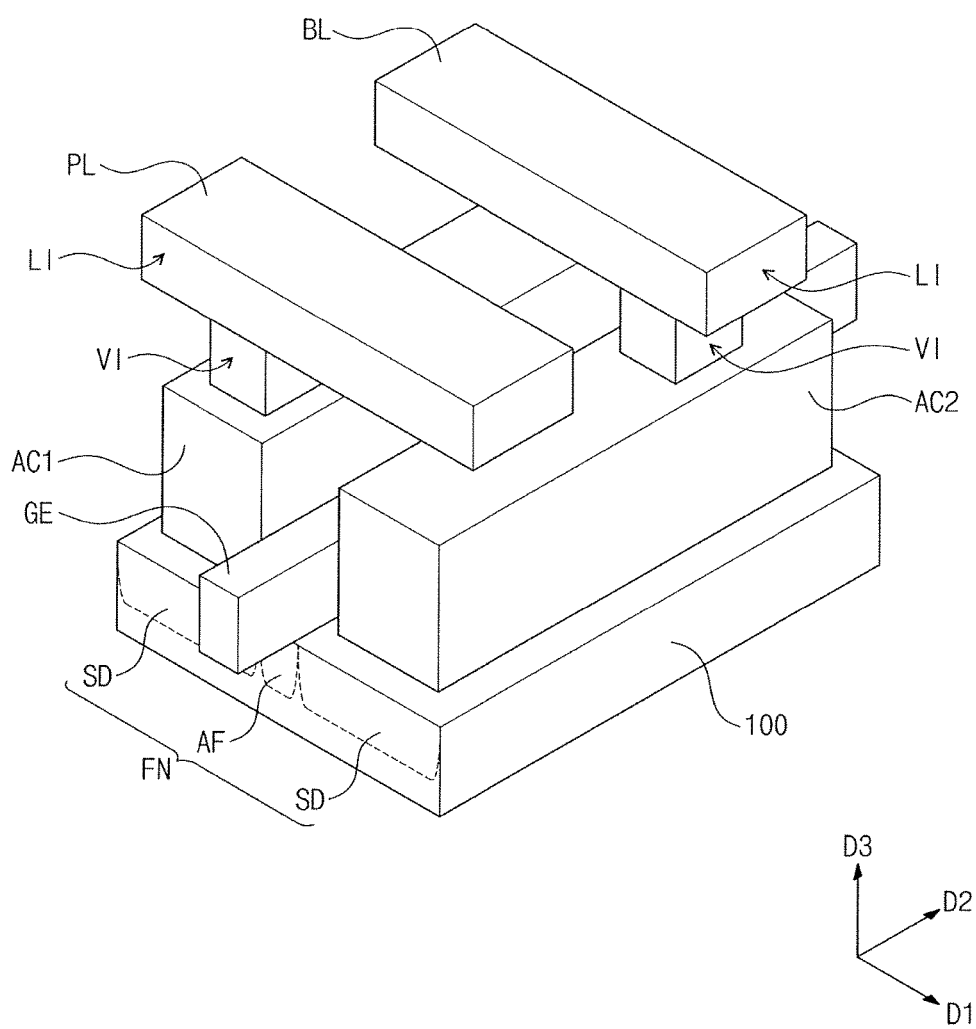
FIGS. 3 to 7 are perspective views illustrating a semiconductor device according to an exemplary embodiment of the present inventive concept.

FIG. 3 is a cross-sectional view illustrating a semiconductor device according to an exemplary embodiment of the present inventive concept. The semiconductor device of FIG. 3 may correspond to the first memory cell or the third memory cell discussed with reference to FIG. 1 or 2.

Referring to FIG. 3, the semiconductor device may include a substrate 100. The substrate 100 may include an active pattern FN. The active pattern FN may include source/drain regions SD and a channel region AF. The channel region AF may be disposed between a pair of the source/drain regions SD. The source/drain regions SD may be adjacent to each other.

The semiconductor device may include a gate electrode GE. The gate electrode GE may be disposed across the active pattern FN. The gate electrode GE may extend in a second direction D2. The second direction D2 may be substantially parallel to an upper surface of the substrate 100. The gate electrode GE may be disposed on the channel region AF. The gate electrode GE may vertically overlap the channel region AF. A gate dielectric pattern may be disposed between the channel region AF and the gate electrode GE. The gate electrode GE may include at least one of a doped semiconductor, a conductive metal nitride (e.g., titanium nitride, tantalum nitride, or the like), or a metal (e.g., aluminum, tungsten, or the like). The gate electrode GE may correspond to the first word line WL1 discussed with reference to FIG. 1 or 2.

Active contacts AC1 and AC2 may be disposed on the source/drain regions SD. The active contacts AC1 and AC2 may include a first active contact AC1 and a second active contact AC2. Each of the first and second active contacts AC1 and AC2 may be in direct contact with an upper surface of the source/drain regions SD. The first and second active contacts AC1 and AC2 may extend in the second direction D2. Accordingly, each of the first and second active contacts AC1 and AC2 may have a major axis in the second direction D2. Each of the first and second active contacts AC1 and AC2 may have an upper surface higher than an upper surface of the gate electrode GE. The first and second active contacts AC1 and AC2 may be spaced apart from the gate electrode GE. As viewed in a plan view, the gate electrode GE may be positioned between the first and second active contacts AC1 and AC2. The first and second active contacts AC1 and AC2 may include at least one of a conductive metal nitride (e.g., titanium nitride, tantalum nitride, or the like) or a metal (e.g., aluminum, tungsten, or the like).

A power line PL and a bit line BL may be disposed on the first and second active contacts AC1 and AC2. The power line PL and the bit line BL may be spaced apart from each other in the second direction D2. Each of the power line PL and the bit line BL may include a conductive line LI and a via VI. The via VI may be positioned below the conductive line LI. The conductive line LI of each of the power line PL and the bit line BL may extend in a first direction D1. The first direction D1 may cross the second direction D2. For example, the conductive line LI and the via VI may be integrally connected to form a single conductor (e.g., the power line PL or the bit line BL). The power line PL and the bit line BL may include at least one of a conductive metal nitride (e.g., titanium nitride, tantalum nitride, or the like) or a metal (e.g., aluminum, tungsten, or the like).

A single via VI may be disposed on each of the first and second active contacts AC1 and AC2. The first active contact AC1 may be connected to the power line PL through the via V1. The source/drain region SD in contact with the first active contact AC1 may be a source of transistor electrically connected to the power line PL. The second active contact AC2 may be connected to the bit line BL through the via V1. The source/drain region SD in contact with the second active contact AC2 may be a drain of transistor electrically connected to the bit line BL. Accordingly, a conductive path may be formed between the bit line BL and the power line PL. Thus, a memory cell according to the present embodiment may exhibit an ON-state.

Figure 4:
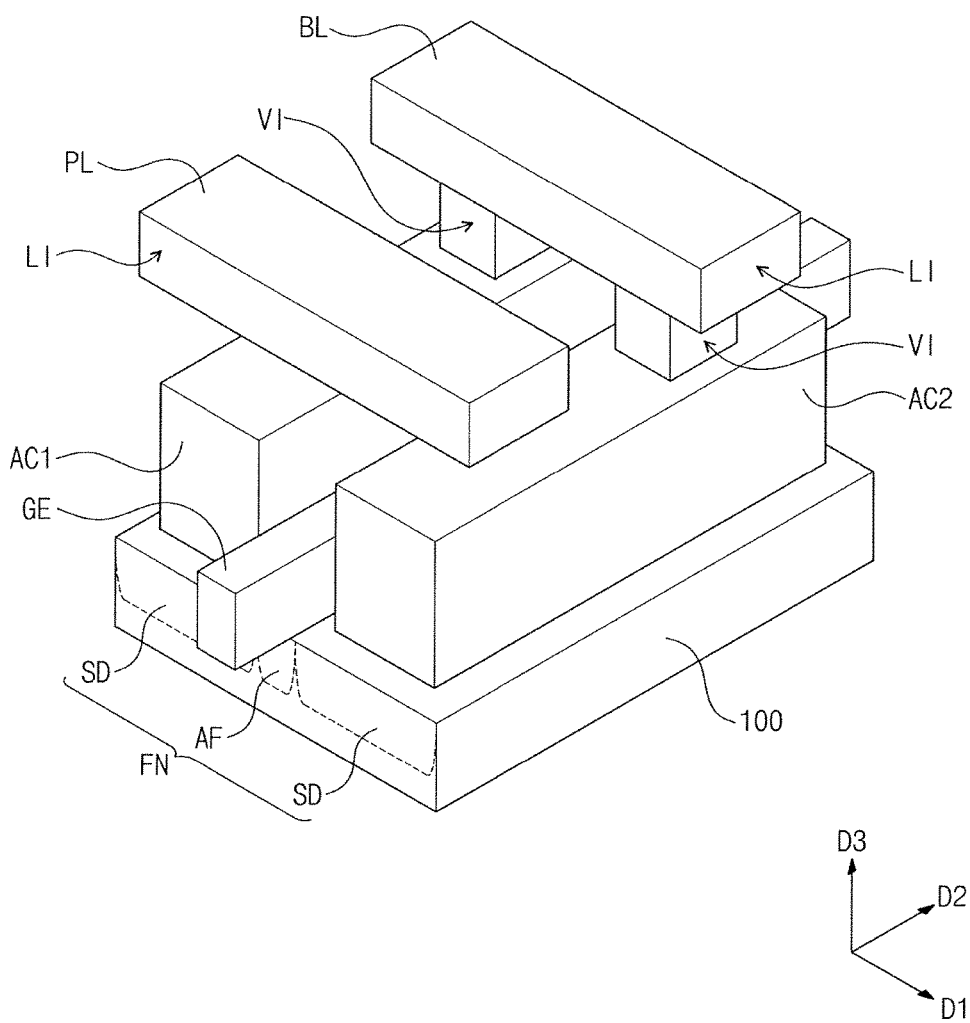

FIG. 4 is a cross-sectional view illustrating a semiconductor device according to an exemplary embodiment of the present inventive concept. A detailed description of technical features repetitive to those discussed with reference to FIG. 3 may be omitted. The semiconductor device illustrated in FIG. 4 may correspond to the second memory cell discussed with reference to FIG. 1 or 2.

Referring to FIG. 4, a single via VI may be disposed on each of the first and second active contacts AC1 and AC2. The via VI may be disposed between the first active contact AC1 and the conductive line LI of the bit line BL. The via VI may also be disposed between the second active contact AC2 and the conductive line LI of the bit line BL. Thus, the first and second active contacts AC1 and AC2 may be electrically connected to a single bit line BL. Accordingly, a conductive path might not be formed between the bit line BL and the power line PL. Thus, a memory cell according to the present embodiment may exhibit an OFF-state.

Figure 5:
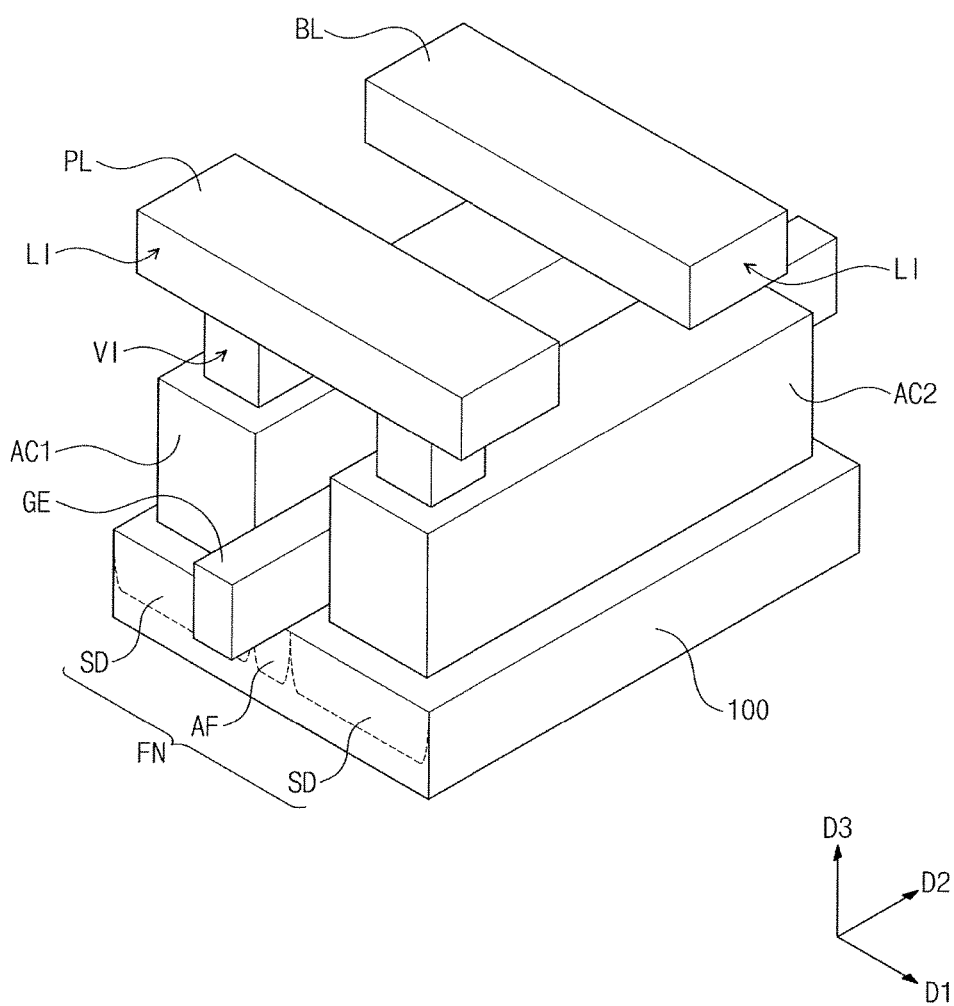

FIG. 5 is a cross-sectional view illustrating a semiconductor device according to an exemplary embodiment of the present inventive concept. A detailed description of technical features repetitive to those formerly discussed with reference to FIG. 3 may be omitted. The semiconductor device illustrated in FIG. 5 may correspond to the fourth memory cell discussed with reference to FIG. 1 or 2.

Referring to FIG. 5, a single via VI may be disposed on each of the first and second active contacts AC1 and AC2. The via VI may be disposed between the first active contact AC1 and the conductive line LI of the power line PL. The via VI may also be disposed between the second active contact AC2 and the conductive line LI of the power line PL. Thus, the first and second active contacts AC1 and AC2 may be electrically connected to a single power line PL. Accordingly, a conductive path might not be formed between the bit line BL and the power line PL. Thus, a memory cell according to the present embodiment may exhibit an OFF-state.

Referring to FIGS. 3 to 5, according to an exemplary embodiment of the present inventive concept, a memory cell may exhibit an ON- or OFF-state depending on an arrangement of the vias VI disposed therein. When the vias VI disposed on the first and second active contacts AC1 and AC2 are arranged staggered in the first direction D1, the memory cell may exhibit an ON-state as illustrated in FIG. 3. When the vias VI disposed on the first and second active contacts AC1 and AC2 are arranged adjacent to each other (or side-by-side) in the first direction D1, the memory cell may exhibit an OFF-state as illustrated in FIGS. 4 and 5. Thus, an arrangement of the vias VI may determine whether the memory cells (e.g., ROM cells) are coded.

Figure 6:
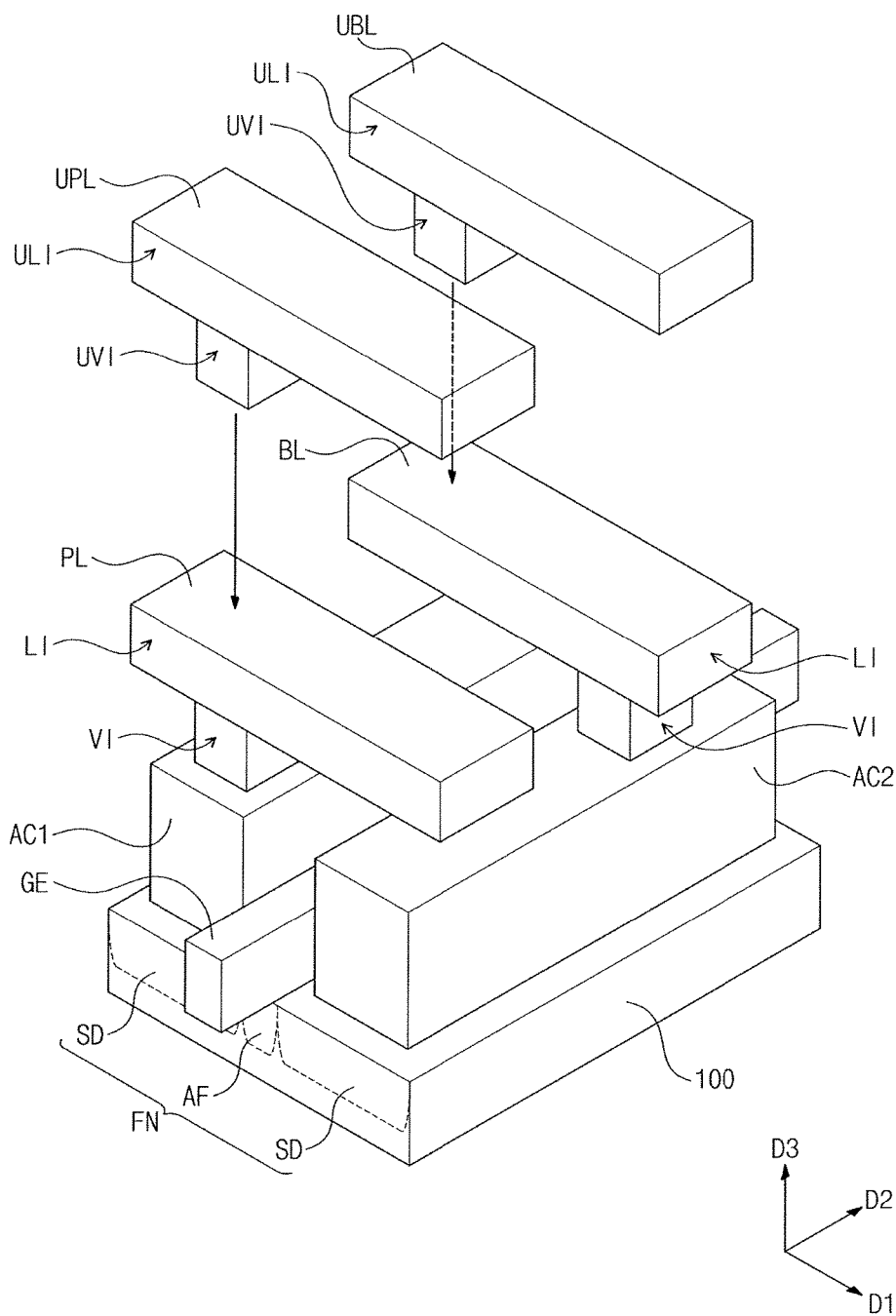

FIG. 6 is a cross-sectional view illustrating a semiconductor device according to an exemplary embodiment of the present inventive concept. A detailed description of technical features repetitive to those formerly discussed with reference to FIG. 3 may be omitted. The semiconductor device illustrated in FIG. 6 may correspond to the first memory cell or the third memory cell discussed with reference to FIG. 1 or 2.

Referring to FIG. 6, an upper power line UPL may be disposed on the power line PL. An upper bit line UBL may be disposed on the bit line BL. As viewed in plan view, the upper power line UPL may overlap the power line PL, and the upper bit line UBL may overlap the bit line BL.

Each of the upper power line UPL and the upper bit line UBL may include an upper conductive line ULI and an upper via UVI. The upper via UVI may be positioned below the upper conductive line ULI. The upper conductive line ULI of each of the upper power line UPL and the upper bit line UBL may extend in the first direction D1. For example, the upper conductive line ULI and the upper via UVI may be integrally connected to form a single conductor (e.g., the upper power line UPL or the upper bit line UBL). The upper power line UPL and the upper bit line UBL may each include at least one of a conductive metal nitride (e.g., titanium nitride, tantalum nitride, or the like) or a metal (e.g., aluminum, tungsten, or the like).

The power line PL and the upper power line UPL may be directly connected to each other to form a single power line. The power line PL and the upper power line UPL may be a single strap structure. The bit line BL and the upper bit line UBL may be directly connected to each other to form a single bit line. The bit line BL and the upper bit line UBL may be a single strap structure.

In a semiconductor device according to the present embodiment, at least two vertically stacked metal lines may be connected into a single line. Accordingly, a resistance of the at least two vertically stacked metal lines may be relatively reduced. The semiconductor device may have an increased operating speed.

Figure 7:
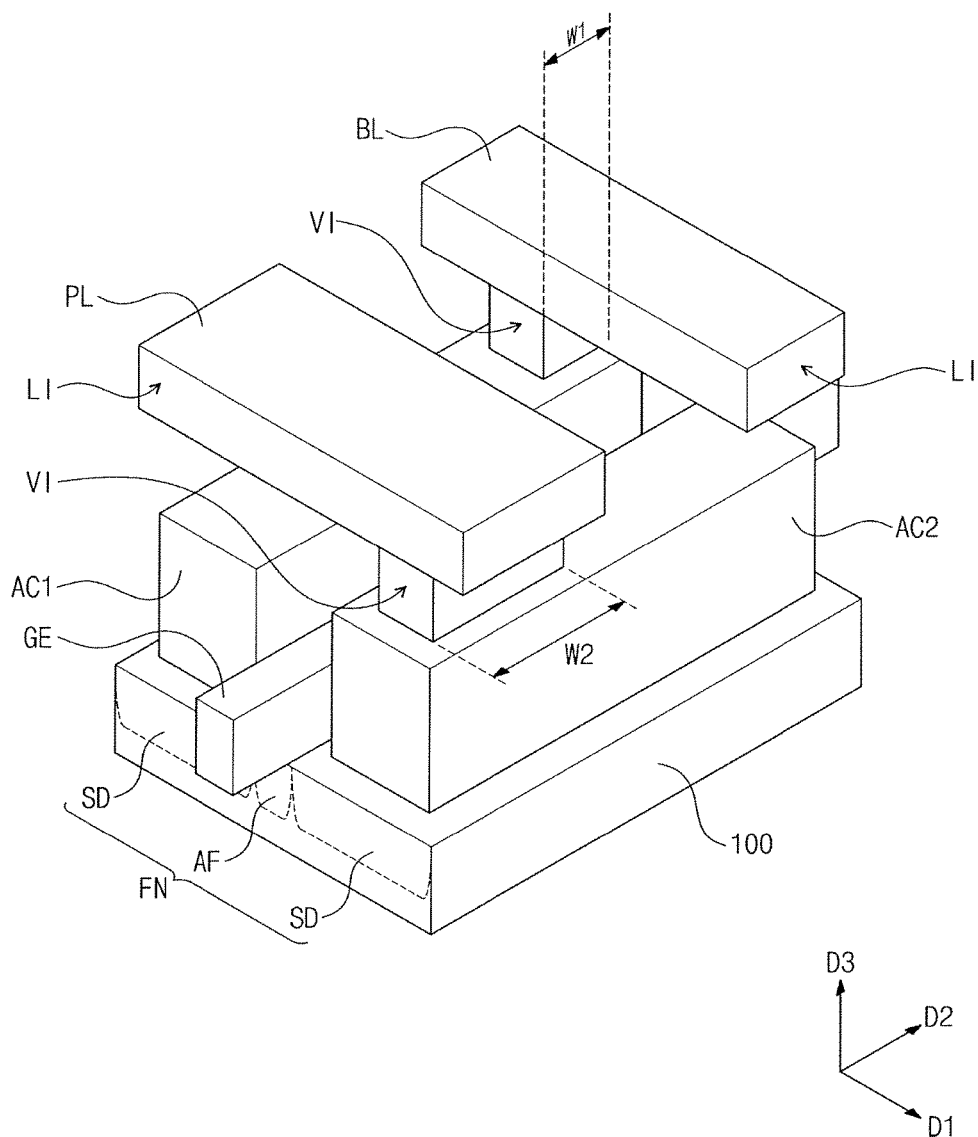

FIG. 7 is a cross-sectional view illustrating a semiconductor device according to an exemplary embodiment of the present inventive concept. A detailed description of technical features repetitive to those formerly discussed with reference to FIG. 3 may be omitted. The semiconductor device illustrated in FIG. 7 may correspond to the first memory cell or the third memory cell discussed with reference to FIG. 1 or 2.

Referring to FIG. 7, the power line PL may have a width in the second direction D2. The bit line BL may have a width in the second direction D2. The width of the power line PL in the second direction D2 may be greater than the width of the bit line BL in the second direction D2. The via VI of the bit line BL may have a first width W1 in the second direction D2. The via VI of the power line PL may have a second width W2 in the second direction D2. The second width W2 may be greater than the first width W1. For example, the second width W2 may be about twice the size as the first width W1. Alternatively, the via VI of the bit line BL may have a width in the first direction D1 substantially the same as a width in the first direction D1 of the via VI of the power line PL.

According to the present embodiment, since the via VI of the power line PL may be larger than the via VI of the bit line BL, a relatively low resistance between the power line PL and the second active contact AC2 may be obtained.

Figure 8:
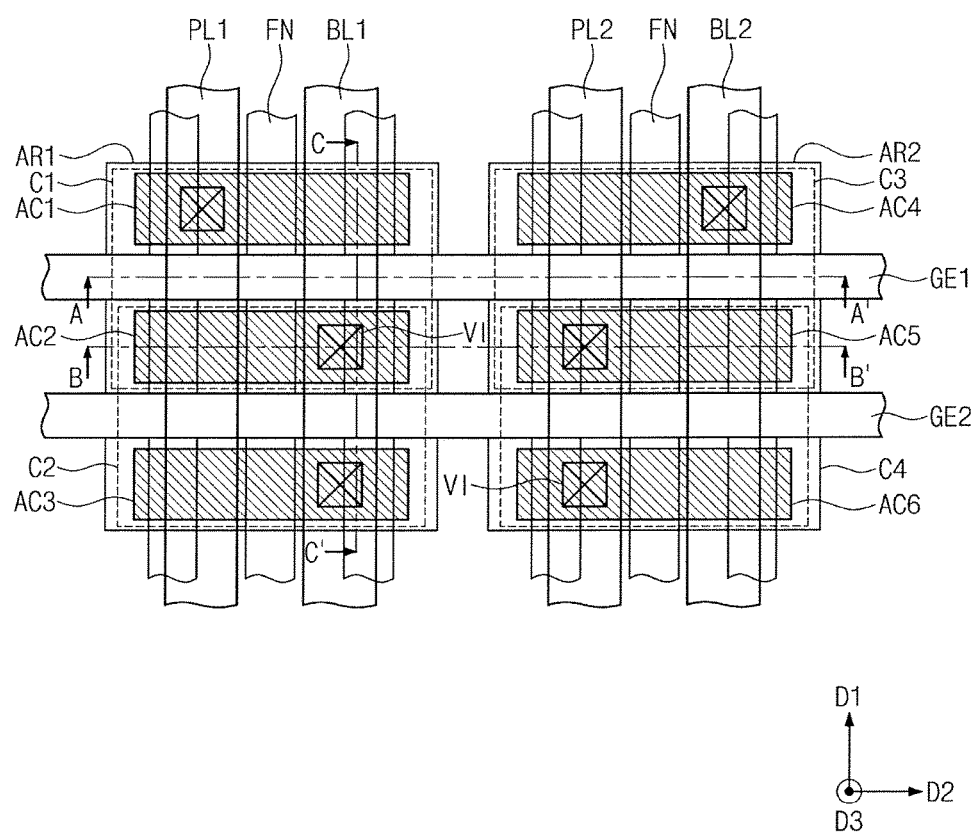
FIG. 8 is a plan view illustrating a semiconductor device according to an exemplary embodiment of the present inventive concept.
Figure 9A:
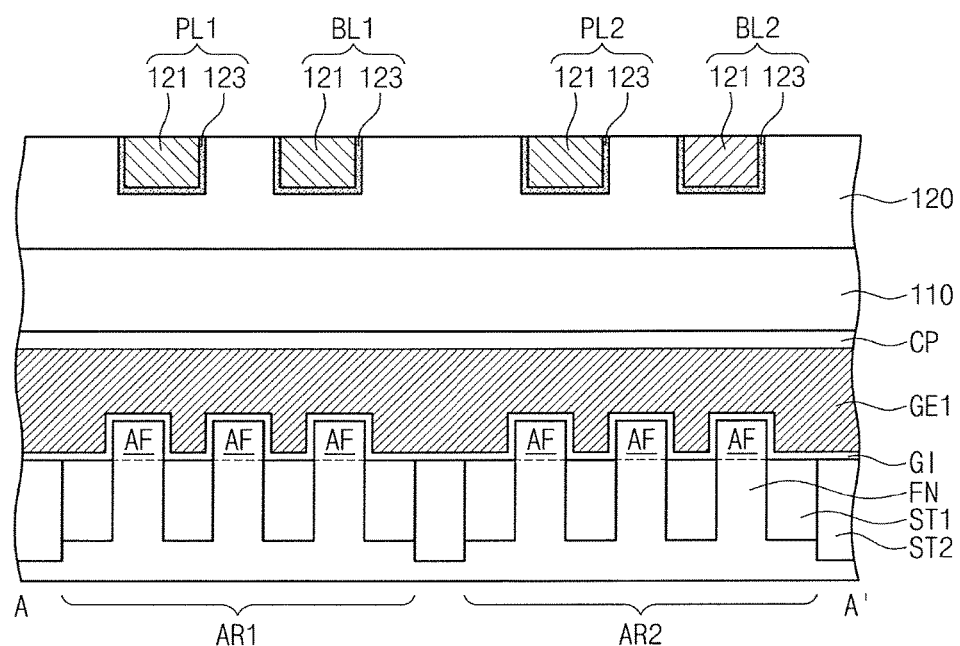
FIGS. 9A to 9C are cross-sectional views taken along lines A-A', B-B', and C-C' of FIG. 8, respectively, according to an exemplary embodiment of the present inventive concept.
Figure 9A:
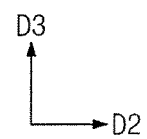
Figure 9B:
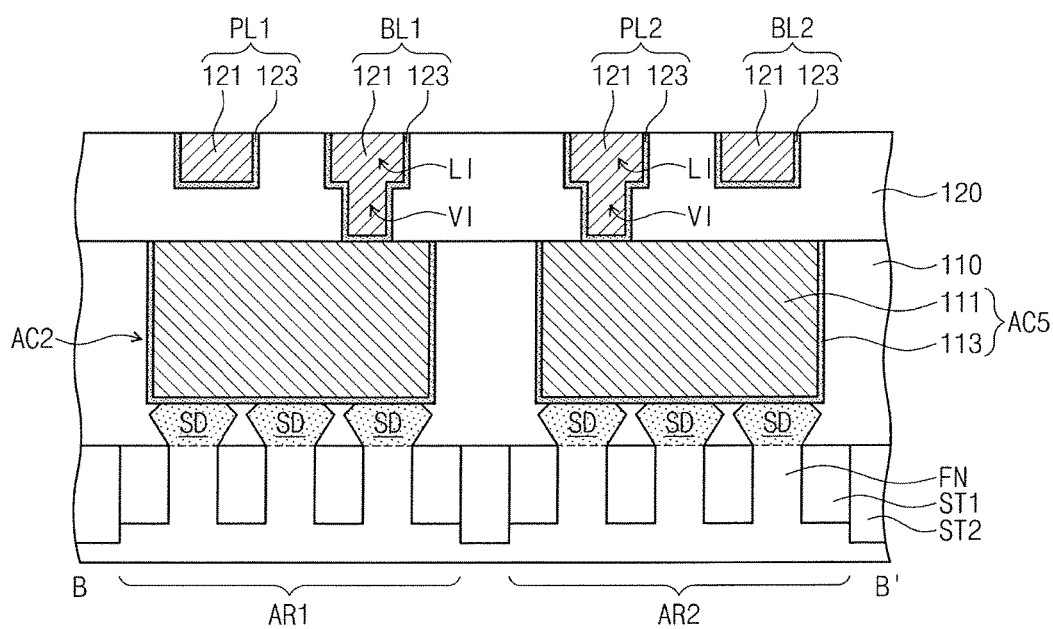
Figure 9B:
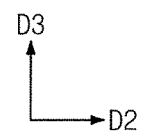
Figure 9C:
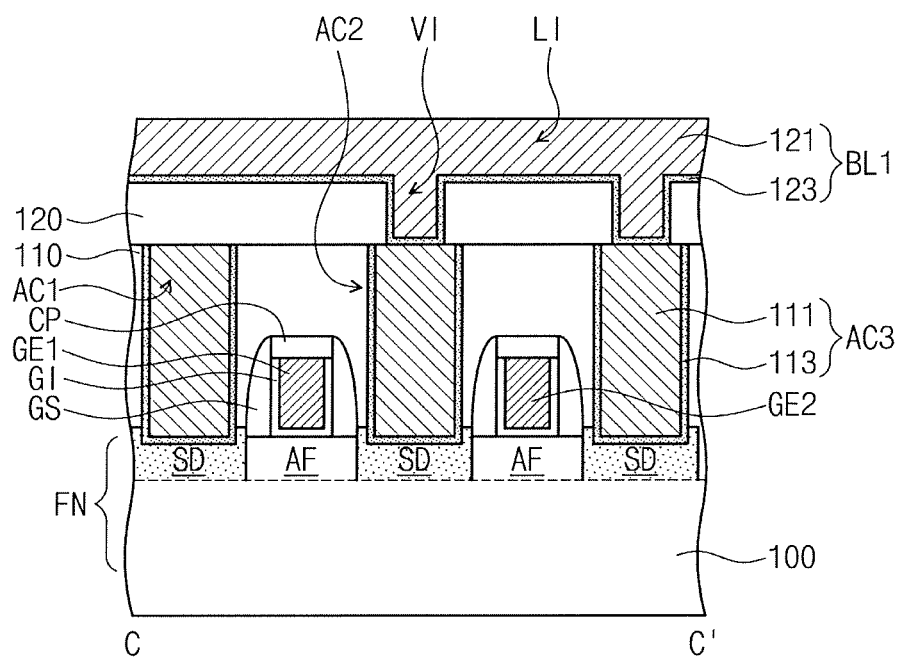
Figure 9C:
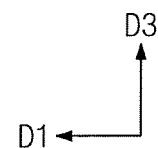

FIG. 8 is a plan view illustrating a semiconductor device according to an exemplary embodiment of the present inventive concept. FIGS. 9A to 9C are cross-sectional views taken along lines A-A', B-B', and C-C' of FIG. 8, respectively, according to an exemplary embodiment of the present inventive concept. A detailed description of technical features repetitive to those formerly discussed with reference to FIGS. 1 to 7 may be omitted.

Referring to FIGS. 1, 2, 8, and 9A to 9C, first to forth memory cells C1 to C4 may be provided on a substrate 100. For example, the substrate 100 may be a silicon substrate, a germanium substrate, or a Silicon-On-Insulator (SOI) substrate. The first to fourth memory cells C1 to C4 may respectively correspond to the first to fourth memory cells C1 to C4 discussed above with reference to FIG. 1 or 2. The first to fourth memory cells C1 to C4 may be ROM cell regions for storing data. Transistors may be disposed in the first to fourth memory cells C1 to C4.

The first and second memory cells C1 and C2 may be arranged in a first direction D1. The third and fourth memory cells C3 and C4 may also be arranged in the first direction D1. The first and second memory cells C1 and C2 may be spaced apart in a second direction D2 from the third and fourth memory cells C3 and C4. The transistor of the first memory cell C1 may share a drain region with the transistor of the second memory cell C2. The transistor of the third memory cell C3 may share a source region with the transistor of the fourth memory cell C4.

The substrate 100 may include a second device isolation layer ST2. The second device isolation layer ST2 may define a first active region AR1 and a second active region AR2. The second device isolation layer ST2 may be positioned at an upper portion of the substrate 100. The second device isolation layer ST2 may surround the first and second active regions AR1 and AR2. The first and second active regions AR1 and AR2 may be spaced apart from each other in the second direction D2 across the second device isolation layer ST2.

The first and second active regions AR1 and AR2 may extend in the first direction D1. The first and second memory cells C1 and C2 may be disposed in the first active region AR1. The third and fourth memory cells C3 and C4 may be disposed in the second active region AR2. The second device isolation layer ST2 may also define additional active regions.

Each of the first and second active regions AR1 and AR2 may include a plurality of active patterns FN. The active patterns FN may extend in the first direction D1. The active patterns FN may be portions of the substrate 100 protruding from an upper surface of the substrate 100. The active patterns FN may be arranged in the second direction D2. Each of the active patterns FN may be provided on opposite sides of the substrate 100, and the first device isolation layers ST1 may extend in the first direction D1. Upper portions of the active patterns FN may vertically protrude from an upper surface of the substrate 100 relative to the first device isolation layers ST1. Each of the upper portions of the active patterns FN may have a fin shape. The fin shape may protrude between first device isolation layers ST1. The pair of first device isolation layers ST1 may be adjacent to each other.

The first device isolation layers ST1 and the second device isolation layer ST2 may be connected to each other, for example, to form a single insulation layer. The second device isolation layer ST2 may have a thickness greater than a thickness of the first device isolation layers ST1. Thus, the first device isolation layers ST1 may be formed by a separate process than a process to form the second device isolation layer ST2. For example, the first and second device isolation layers ST1 and ST2 may each include a silicon oxide layer.

First and second gate electrodes GE1 and GE2 may extend in the second direction D2. The first and second gate electrodes GE1 and GE2 may be disposed across the active patterns FN. The first and second gate electrodes GE1 and GE2 may be spaced apart from each other in the first direction D1. The first and second gate electrodes GE1 and GE2 may extend from the first active region AR1 to the second active region AR2. The first and second gate electrodes GE1 and GE2 may be disposed in the first and second active regions AR1 and AR2. For example, the first gate electrode GE1 may be disposed in the first active region AR1, the second device isolation layer ST2, and the second active region AR2 while extending in the second direction D2. The first and second gate electrodes GE1 and G2 may respectively correspond to the first and second word lines WL1 and WL2 discussed above with reference to FIGS. 1 and 2.

A gate dielectric pattern GI may be provided, for example, below each of the first and second gate electrodes GE1 and GE2. Gate spacers GS may be provided, for example, on opposite sides of each of the first and second gate electrodes GE1 and GE2. A capping pattern CP may cover an upper surface of each of the first and second gate electrodes GE1 and GE2. First and second interlayer dielectric layers 110 and 120 may cover each of the active patterns FN and the first and second gate electrodes GE1 and GE2.

The first and second gate electrodes GE1 and GE2 may include at least one of a doped semiconductor, a conductive metal nitride, or a metal. The gate dielectric pattern GI may include a silicon oxide layer, a silicon oxynitride layer, or a high-k dielectric layer. The high-k dielectric layer may have a dielectric constant greater than a dielectric constant of a silicon oxide layer. Each of the capping pattern CP and the gate spacers GS may include at least one of a silicon oxide layer, a silicon nitride layer, and a silicon oxynitride layer. Each of the first and second interlayer dielectric layers 110 and 120 may include a silicon oxide layer or a silicon oxynitride layer.

Source/drain regions SD may be provided at the upper portions of the active patterns FN. A pair of the source/drain regions SD may be positioned at opposite sides of each of the first and second gate electrodes GE1 and GE2. When the NMOSFETs of FIG. 1 are included in a semiconductor device according to the present embodiment, the source/drain regions SD may be n-type impurity regions. When the PMOSFETs of FIG. 2 are included in a semiconductor device according to the present embodiment, the source/drain regions SD may be p-type impurity regions.

Channel regions AF may be provided at the upper portions of the active patterns FN. The channel regions AF may vertically overlap the first and second gate electrodes GE1 and GE2. Each of the channel regions AF may be disposed between a pair of the source/drain regions SD.

The source/drain regions SD may be epitaxial patterns formed by a selective epitaxial growth process. The source/drain regions SD may have upper surfaces positioned higher than upper surfaces of the channel regions AF. The source/drain regions SD may include a semiconductor element. The semiconductor element may be different from a semiconductor element of the substrate 100. When the NMOSFETs of FIG. 1 are included in a semiconductor device according to the present embodiment, the source/drain regions SD may include a semiconductor element having a lattice constant equal to or smaller than a lattice constant of a semiconductor element included in the substrate 100. As a result, the second source/drain regions SD2 may provide the channel regions AF with a tensile stress. When the PMOSFETs of FIG. 2 are included in a semiconductor device according to the present embodiment, the source/drain regions SD may include a semiconductor element having a lattice constant greater than a lattice constant of a semiconductor element included in the substrate 100. For example, when the substrate 100 is a silicon substrate, the source/drain regions SD may include germanium (Ge). As a result, the second source/drain regions SD2 may provide the channel regions AF with a compressive stress.

First to sixth active contacts AC1 to AC6 may be provided in the first interlayer dielectric layer 110. The first to sixth active contacts AC1 to AC6 may have upper surfaces substantially coplanar with upper surfaces of the first interlayer dielectric layer 110. The first to sixth active contacts AC1 to AC6 may be disposed on the source/drain regions SD. The first to sixth active contacts AC1 to AC6 may extend in the second direction D2. Each of the first to sixth active contacts AC1 to AC6 may be connected to a plurality of the source/drain regions SD. Each of the first to sixth active contacts AC1 to AC6 may be contact with three source/drain regions SD; however, exemplary embodiments of the present inventive concept are not limited thereto. The first to sixth active contacts AC1 to AC6 may include at least one of a metal or a conductive metal nitride.

The first active contact AC1 may be provided on a side of the first gate electrode GE1 on the first active region AR1. The second active contact AC2 may be provided between the first and second gate electrodes GE1 and GE2 on the first active region AR1. The third active contact AC3 may be provided on a side of the second gate electrode GE2 on the first active region AR1. The first active contact AC1 may be connected to a source of transistor of the first memory cell C1. The third active contact AC3 may be connected to a source of transistor of the second memory cell C2. The second active contact AC2 may be connected to a common drain of transistors of the first and second memory cells C1 and C2.

The fourth active contact AC4 may be provided on a side of the first gate electrode GE1 on the second active region AR2. The fifth active contact AC5 may be provided between the first and second gate electrodes GE1 and GE2 on the second active region AR2. The sixth active contact AC6 may be provided on a side of the second gate electrode GE2 on the second active region AR2. The fourth active contact AC4 may be connected to a drain of transistor of the third memory cell C3. The sixth active contact AC6 may be connected to a drain of transistor of the fourth memory cell C4. The fifth active contact AC5 may be connected to a common source of transistors of the third and fourth memory cells C3 and C4.

Each of the first to sixth active contacts AC1 to AC6 may include a first conductive pattern 111 and a first barrier pattern 113. The first barrier pattern 113 may be disposed between the first conductive pattern 111 and the first interlayer dielectric layer 110. The first barrier pattern 113 may directly cover sidewalls and a lower surface of the first conductive pattern 111 except for its top surface. The first barrier pattern 113 may prevent a metallic material of the first conductive pattern 111 from diffusing into the first interlayer dielectric layer 110. The first conductive pattern 111 may include a metal (e.g., aluminum, tungsten, or the like). The first barrier pattern 113 may include a conductive metal nitride (e.g., titanium nitride, tantalum nitride, or the like).

The second interlayer dielectric layer 120 may include first and second power lines PL1 and PL2 and first and second bit lines BL1 and BL2. The first and second power lines PL1 and PL2 and the first and second bit lines BL1 and BL2 may have upper surfaces substantially coplanar with an upper surface of the second interlayer dielectric layer 120. The first power line PL1 and the first bit line BL1 may be disposed on the first active region AR1. The second power line PL2 and the second bit line BL2 may each be disposed on the second active region AR2. The first and second power lines PL1 and PL2 and the first and second bit lines BL1 and BL2 may each extend in parallel to each other in the first direction D1.

When the NMOSFETs of FIG. 1 are included in a semiconductor device according to the present embodiment, the first and second power lines PL1 and PL2 may be VSS lines. When the PMOSFETs of FIG. 2 are included in a semiconductor device according to the present embodiment, the first and second power lines PL1 and PL2 may be VDD lines.

Each of the first and second power lines PL1 and PL2 and the first and second bit lines BL1 and BL2 may include a conductive line LI and a via VI. The via VI may be positioned below the conductive line LI. The conductive line LI may have a lower surface higher than a lower surface of the second interlayer dielectric layer 120. The via VI may vertically extend toward the substrate 100 from the lower surface of the conductive line LI. The conductive line LI and the via VI may be connected to form a single conductor. A single via VI may be disposed on each of the first to sixth active contacts AC1 to AC6. The via VI may be in contact with each of the first to sixth active contacts AC1 to AC6.

The first active contact AC1 may be connected to the first power line PL1 through the via V1. The second active contact AC2 may be connected to the first bit line BL1 through the via V1. The third active contact AC3 may be connected to the first bit line BL1 through the via V1. A conductive path may be formed between the first bit line BL1 and the first power line PL1 on the first memory cell C1. Thus, the first memory cell C1 may exhibit an ON-state. Since a conductive path might not be created between the first bit line BL1 and the first power line PL1 on the second memory cell C2, the second memory cell C2 may exhibit an OFF-state.

The fourth active contact AC4 may be connected to the second bit line BL2 through the via V1. The fifth active contact AC5 may be connected to the second power line PL2 through the via V1. The sixth active contact AC6 may be connected to the second power line PL2 through the via V1. As a conductive path may be formed between the second bit line BL2 and the second power line PL2 on the third memory cell C3. Thus, the third memory cell C3 may exhibit an ON-state. As a conductive path might not be created between the second bit line BL2 and the second power line PL2 on the fourth memory cell C4, the fourth memory cell C4 may exhibit an OFF-state.

Each of the first and second power lines PL1 and PL2 and the first and second bit lines BL1 and BL2 may include a second conductive pattern 121 and a second barrier pattern 123. The second barrier pattern 123 may be disposed between the second conductive pattern 121 and the second interlayer dielectric layer 120. The second barrier pattern 123 may directly cover sidewalls and a lower surface of the second conductive pattern 121 except for its top surface. The second barrier pattern 123 may prevent a metallic material of the second conductive pattern 121 from diffusing into the second interlayer dielectric layer 120. The second conductive pattern 121 may include a metal (e.g., aluminum, tungsten, or the like), and the second barrier pattern 123 may include conductive metal nitride (e.g., titanium nitride, tantalum nitride, or the like).

According to exemplary embodiments of the present inventive concept, a single active contact layer may be formed by the first to sixth active contacts AC1 to AC6 positioned at the same level. A single metal layer may be formed by the first and second power lines PL1 and PL2 and the first and second bit lines BL1 and BL2 positioned at the same level. When additional metal layers are present on the metal layer, parasitic capacitance may occur. Parasitic capacitance may reduce an operating speed and increase power consumption of a device. According to exemplary embodiments of the present inventive concept, a semiconductor device may include a substrate with memory cells formed by a single active contact layer and a single metal layer. Thus, an operation speed of the device may be increased and power consumption of the device may be decreased.

According to exemplary embodiments of the present inventive concept, transistors of adjacent memory cells may share a source/drain region therebetween. Therefore, integration of the memory cell may be increased.

Figure 10:
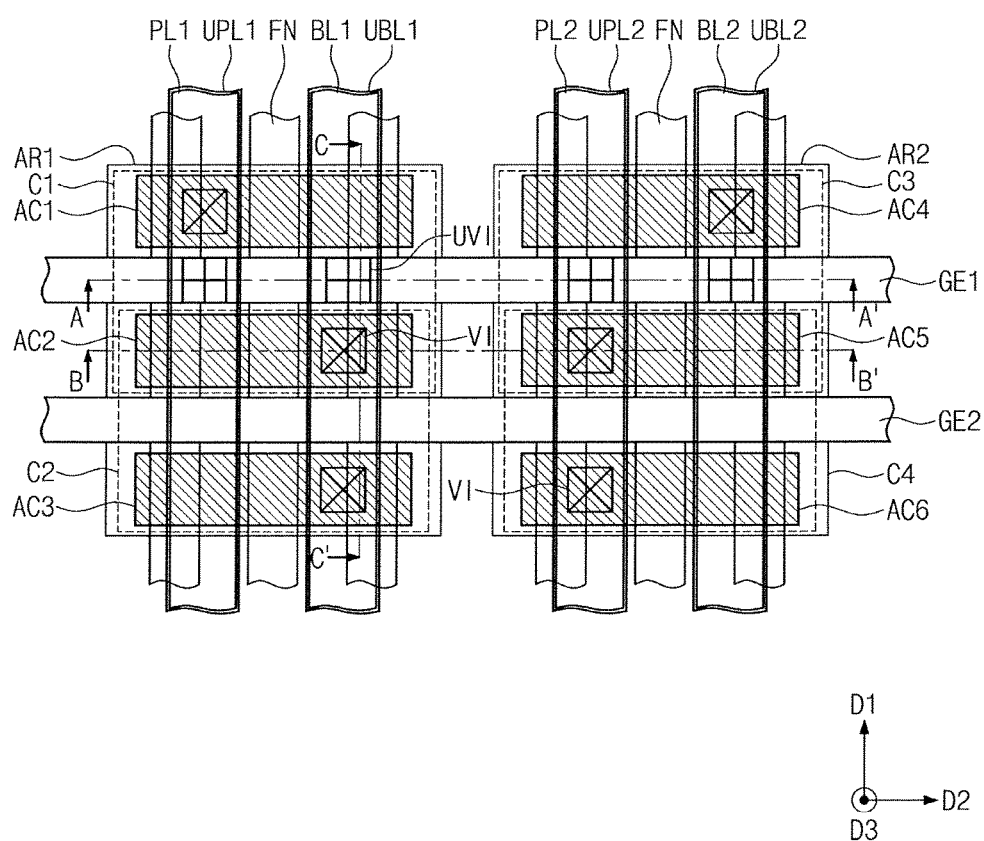
FIG. 10 is a plan view illustrating a semiconductor device according to an exemplary embodiment of the present inventive concept.
Figure 11A:
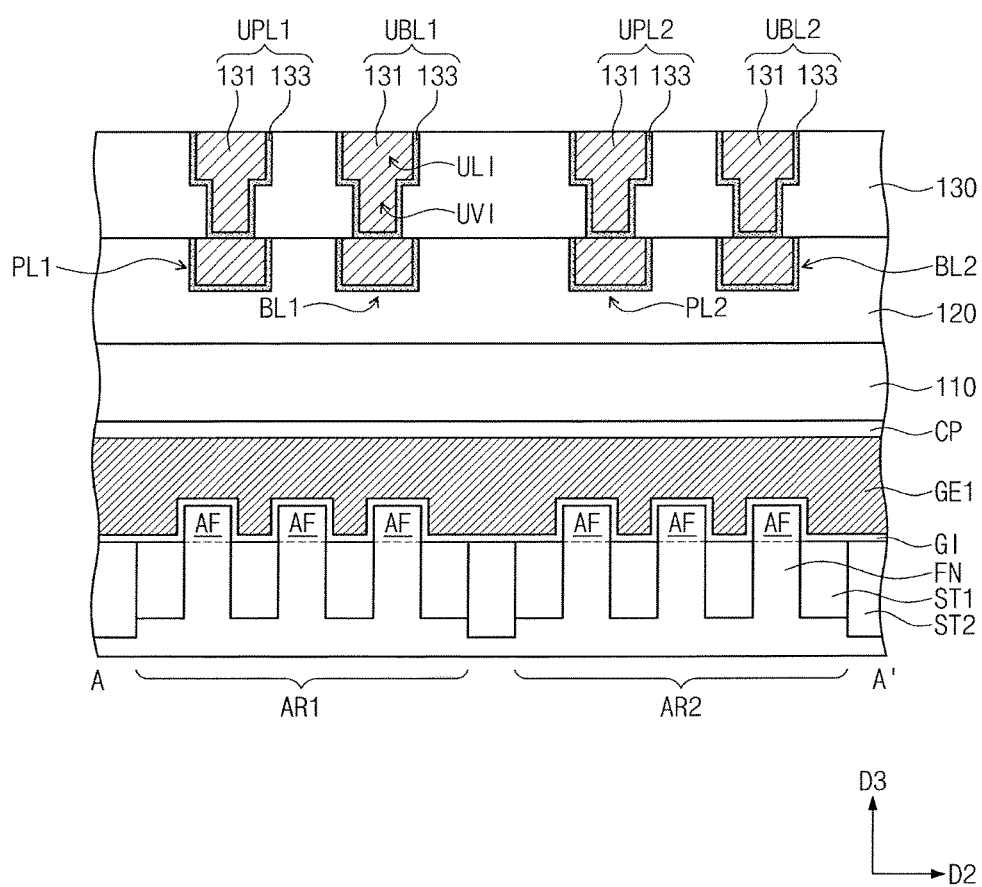
FIGS. 11A to 11C are cross-sectional views taken along lines A-A', B-B', and C-C' of FIG. 10, respectively, according to an exemplary embodiment of the present inventive concept.
Figure 11B:
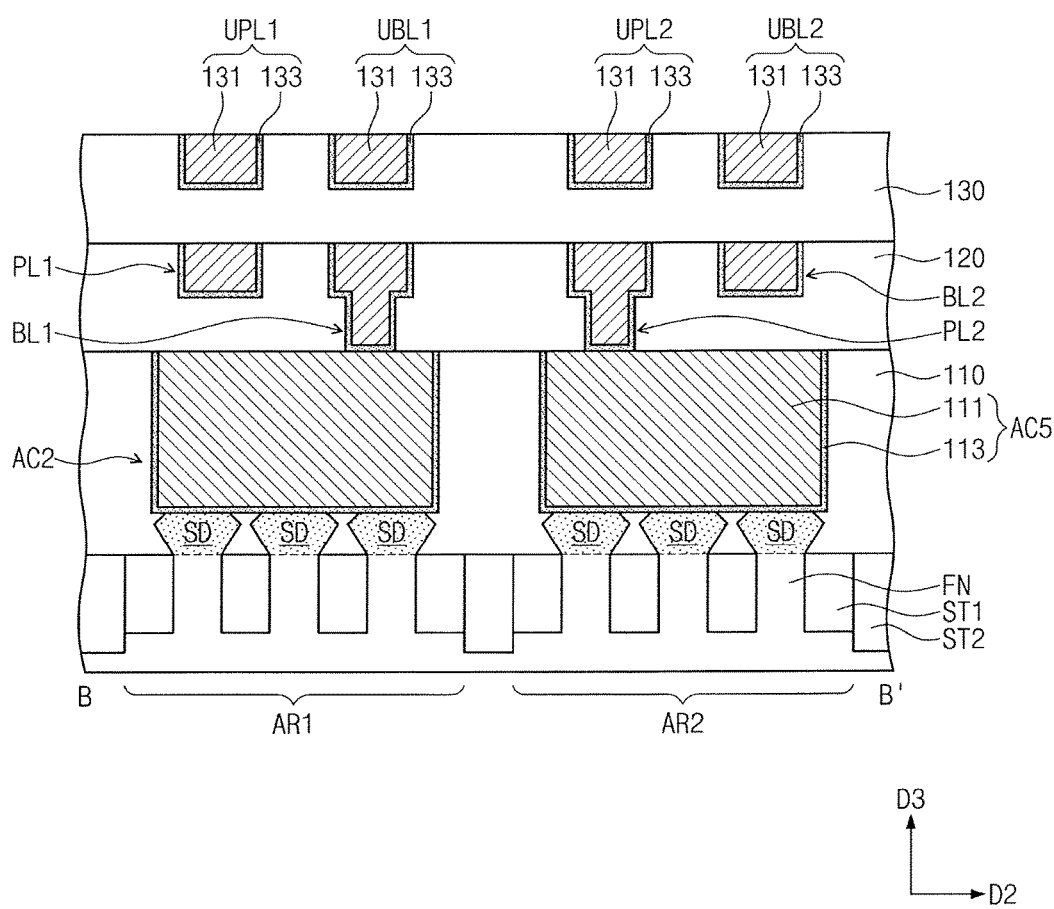
Figure 11C:
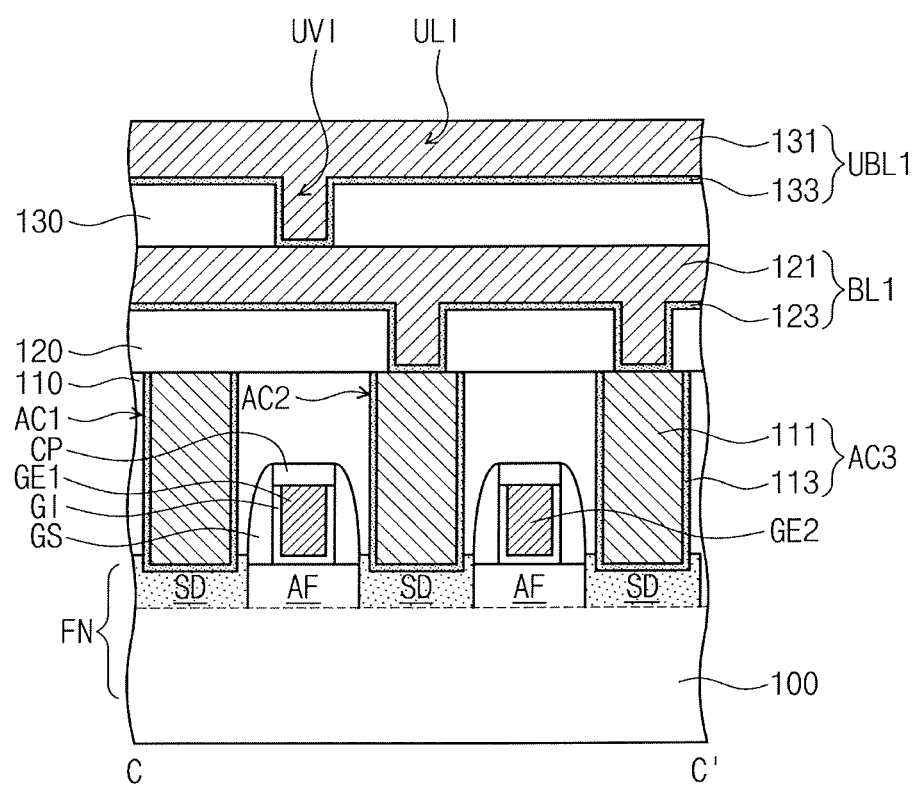

FIG. 10 is a plan view illustrating a semiconductor device according to an exemplary embodiment of the present inventive concept. FIGS. 11A to 11C are cross-sectional views taken along lines A-A', B-B', and C-C' of FIG. 10, respectively, according to an exemplary embodiments of the present inventive concept. A detailed description of technical features repetitive to those discussed with reference to FIGS. 1, 2, 8, and 9A to 9C may be omitted.

Referring to FIGS. 10 and 11A to 11C, a first upper power line UPL1 may be disposed on the first power line PL1. A first upper bit line UBL1 may be disposed on the first bit line BL1. A second upper power line UPL2 may be disposed on the second power line PL2. A second upper bit line UBL2 may be disposed on the second bit line BL2. As viewed in a plan view, the first upper power line UPL1 may overlap the first power line PL1. The first upper bit line UBL1 may overlap the first bit line BL1. The second upper power line UPL2 may overlap the second power line PL2. The second upper bit line UBL2 may overlap the second bit line BL2.

As discussed above with reference to FIG. 6, the first power line PL1 and the first upper power line UPL1 may be connected to each other and may form a single power line. The second power line PL2 and the second upper power line UPL2 may be connected to each other and may form a single power line. The first bit line BL1 and the first upper bit line UBL1 may be connected to each other to form a single bit line. The second bit line BL2 and the second upper bit line UBL2 may be connected to each other to form a single bit line.

FIGS. 12, 14, 16, 18, 20, 21, 22, and 24 are plan views illustrating a method of manufacturing a semiconductor device according to an exemplary embodiment of the present inventive concept. FIGS. 13A, 15A, 17A, 19A, 23A, and 25A are cross-sectional views corresponding to line A-A' of FIGS. 12, 14, 16, 18, 22, and 24, respectively, according to an exemplary embodiment of the present inventive concept. FIGS. 13B, 15B, 17B, 19B, 23B, and 25B are cross-sectional views corresponding to line B-B' of FIGS. 12, 14, 16, 18, 22, and 24, respectively, according to an exemplary embodiment of the present inventive concept. FIGS. 15C, 17C, 19C, 23C, and 25C are cross-sectional views corresponding to line C-C' of FIGS. 14, 16, 18, 22, and 24, respectively, according to an exemplary embodiment of the present inventive concept.

Figure 12:
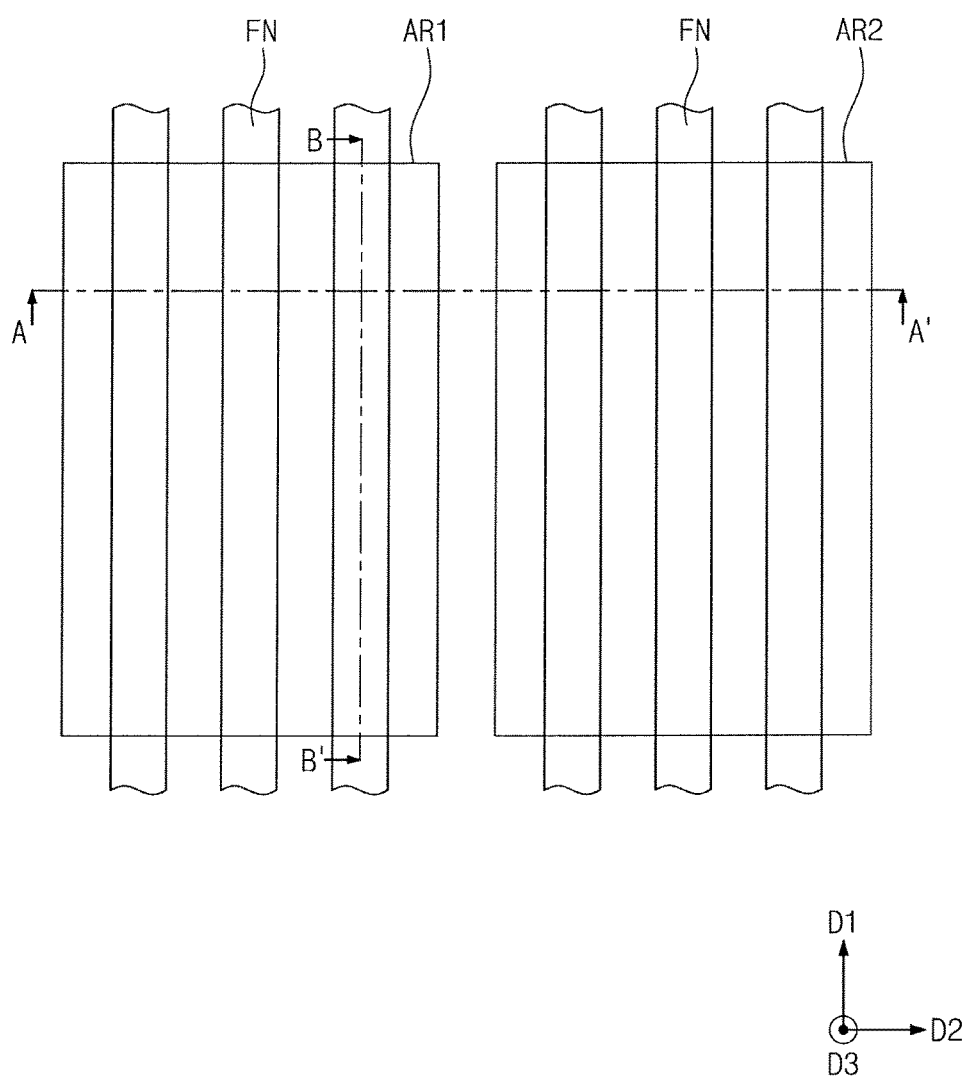
FIGS. 12, 14, 16, 18, 20, 21, 22, and 24 are plan views illustrating a method of manufacturing a semiconductor device according to an exemplary embodiment of the present inventive concept.
Figure 13A:
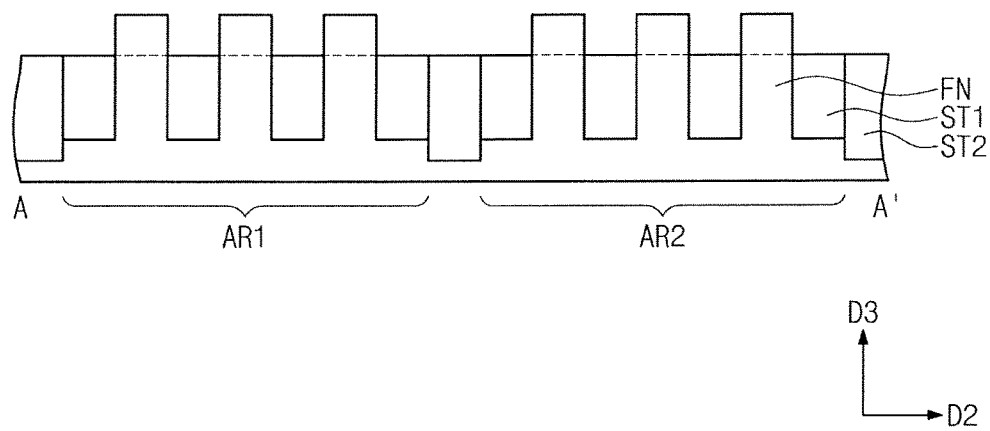
FIGS. 13A, 15A, 17A, 19A, 23A, and 25A are cross-sectional views corresponding to line A-A' of FIGS. 12, 14, 16, 18, 22, and 24, respectively, according to an exemplary embodiment of the present inventive concept.
Figure 13B:
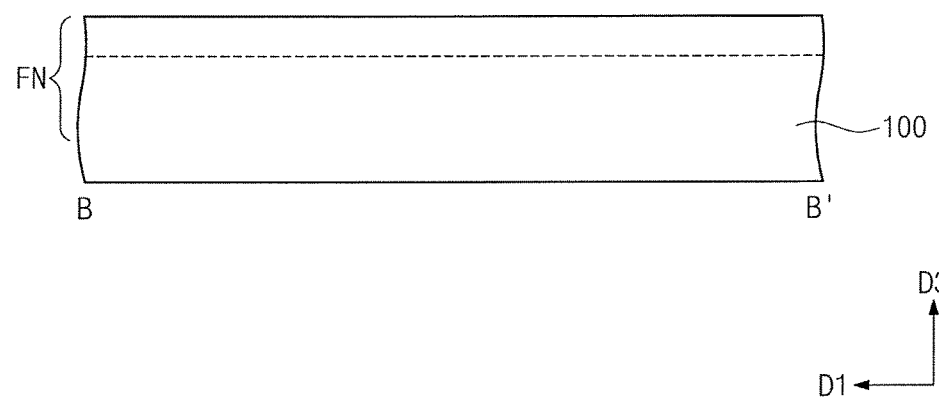
FIGS. 13B, 15B, 17B, 19B, 23B, and 25B are cross-sectional views corresponding to line B-B' of FIGS. 12, 14, 16, 18, 22, and 24, respectively, according to an exemplary embodiment of the present inventive concept.
Figure 14:
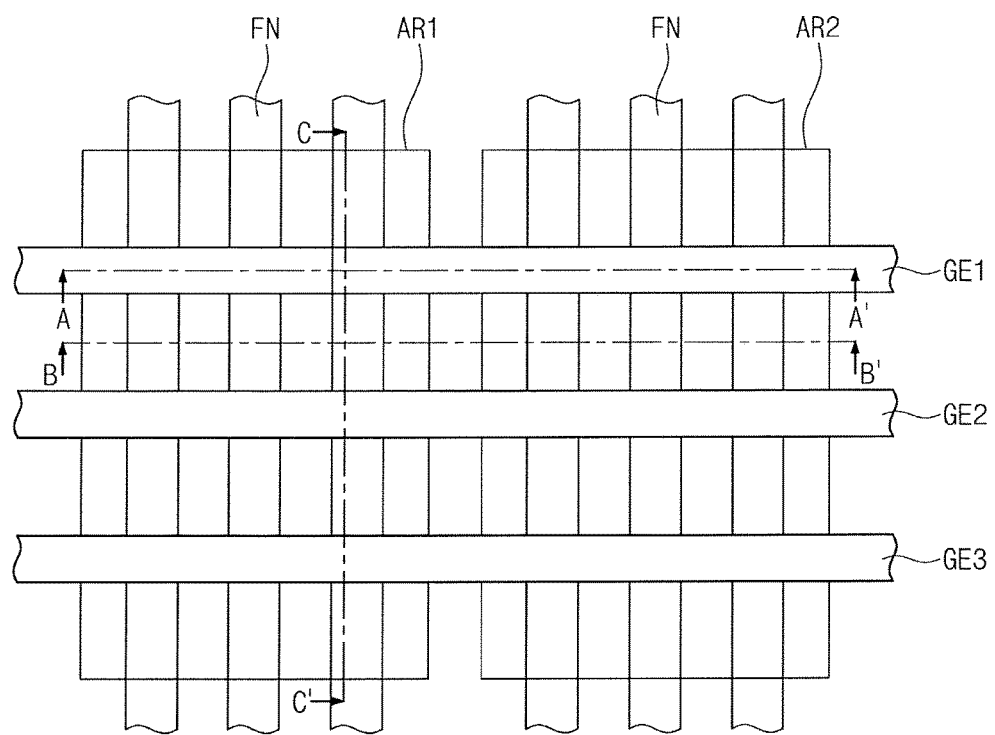
Figure 14:
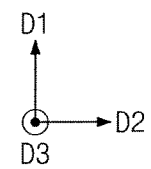
Figure 15A:
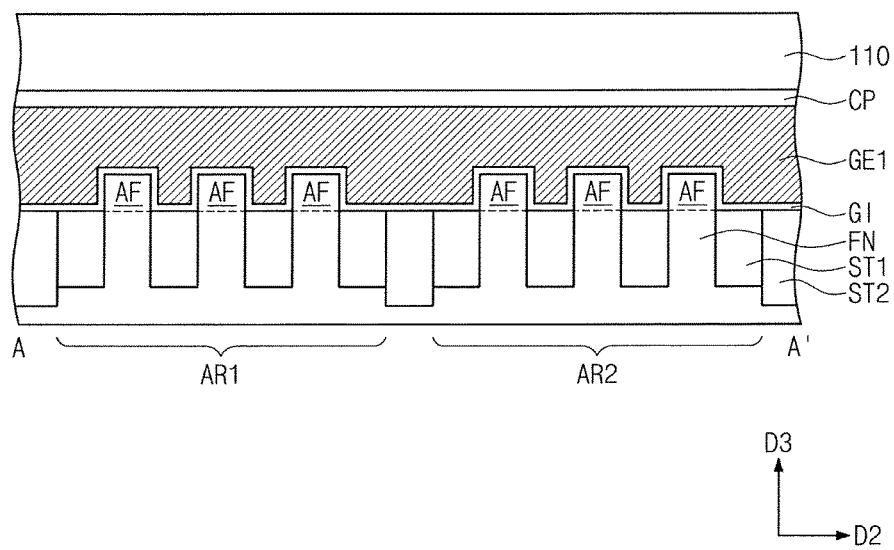
Figure 15B:
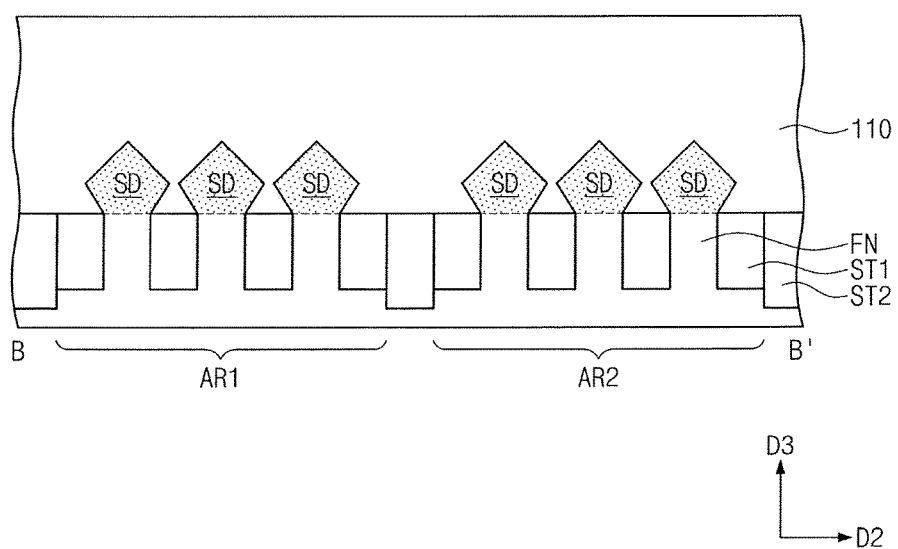
Figure 15C:
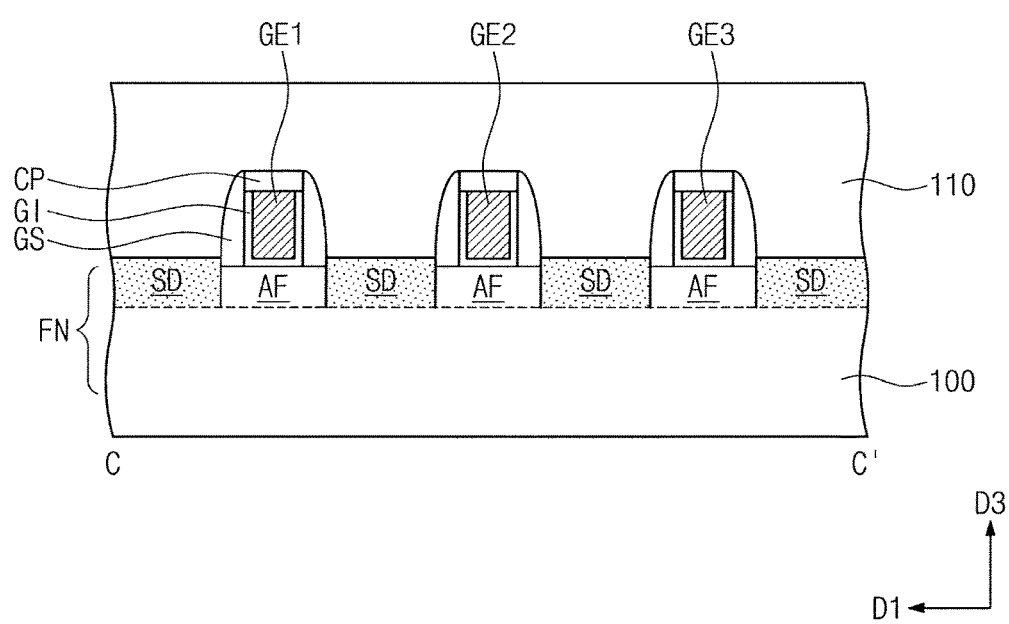
FIGS. 15C, 17C, 19C, 23C, and 25C are cross-sectional views corresponding to line C-C' of FIGS. 14, 16, 18, 22.
Figure 16:
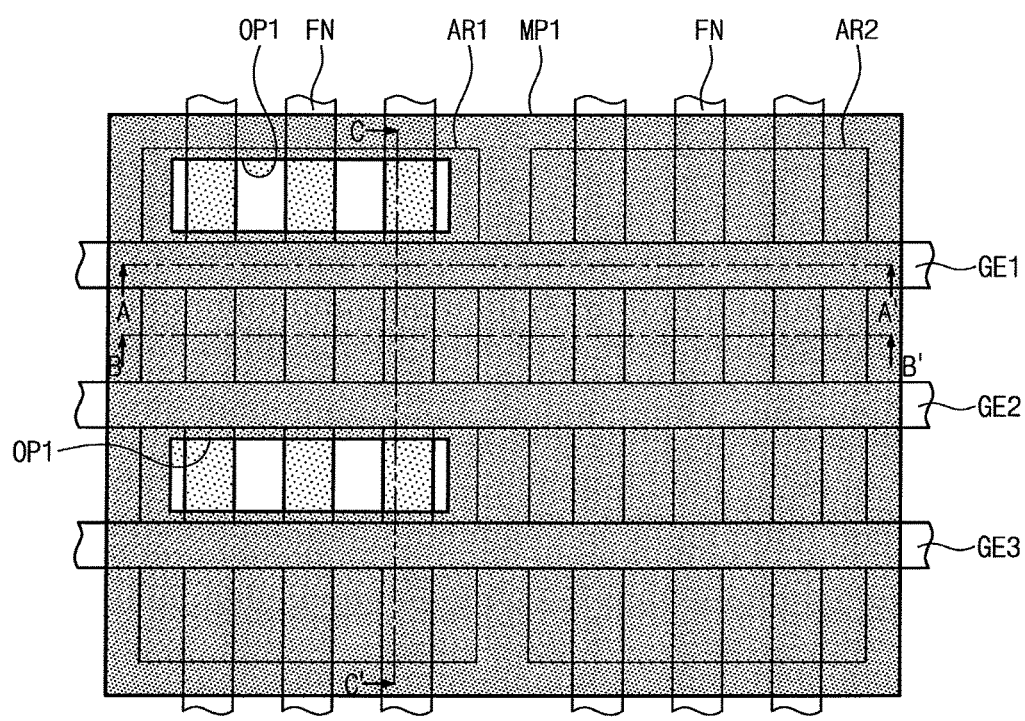
Figure 16:
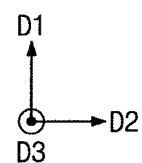
Figure 17A:
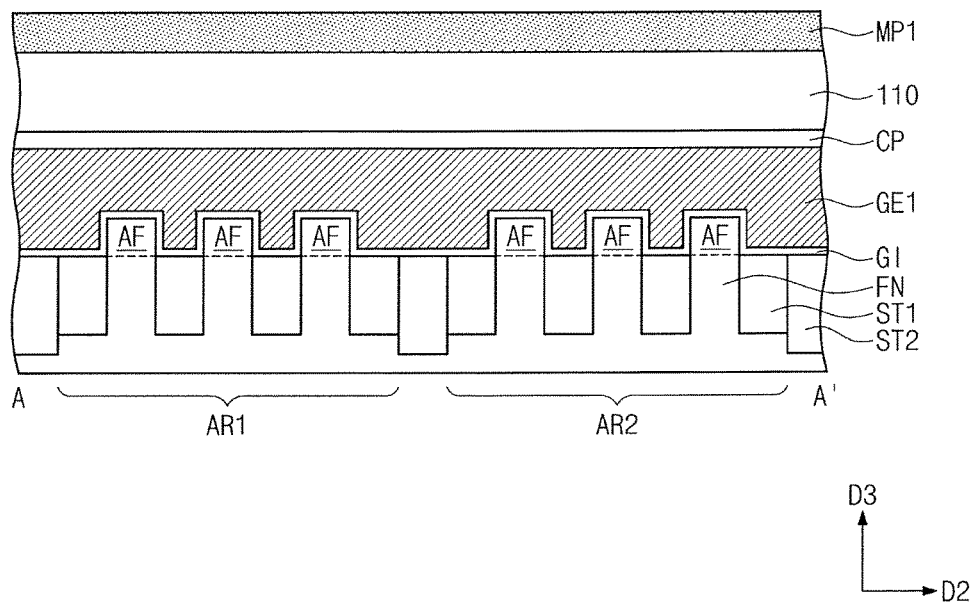
Figure 17B:
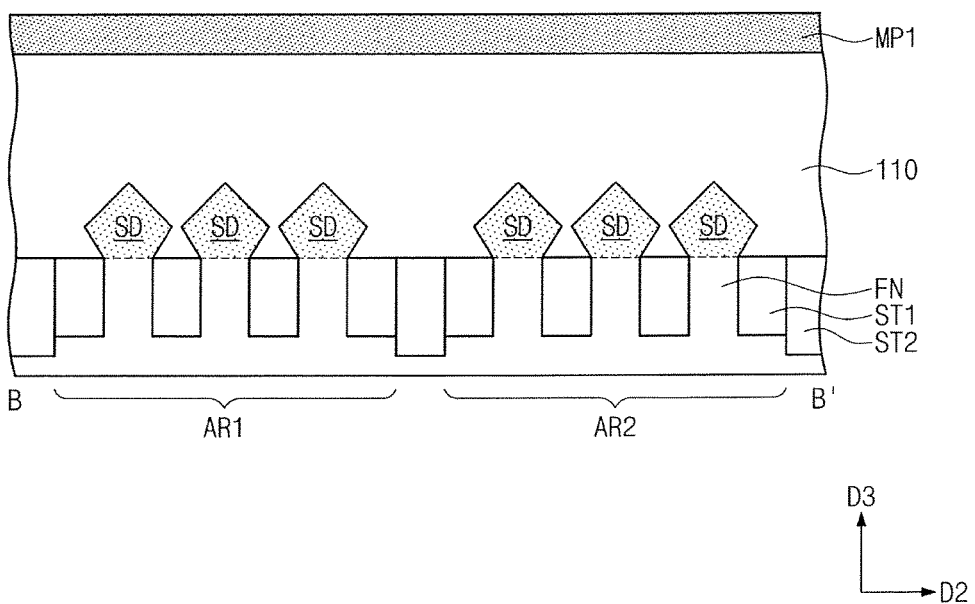
Figure 17C:
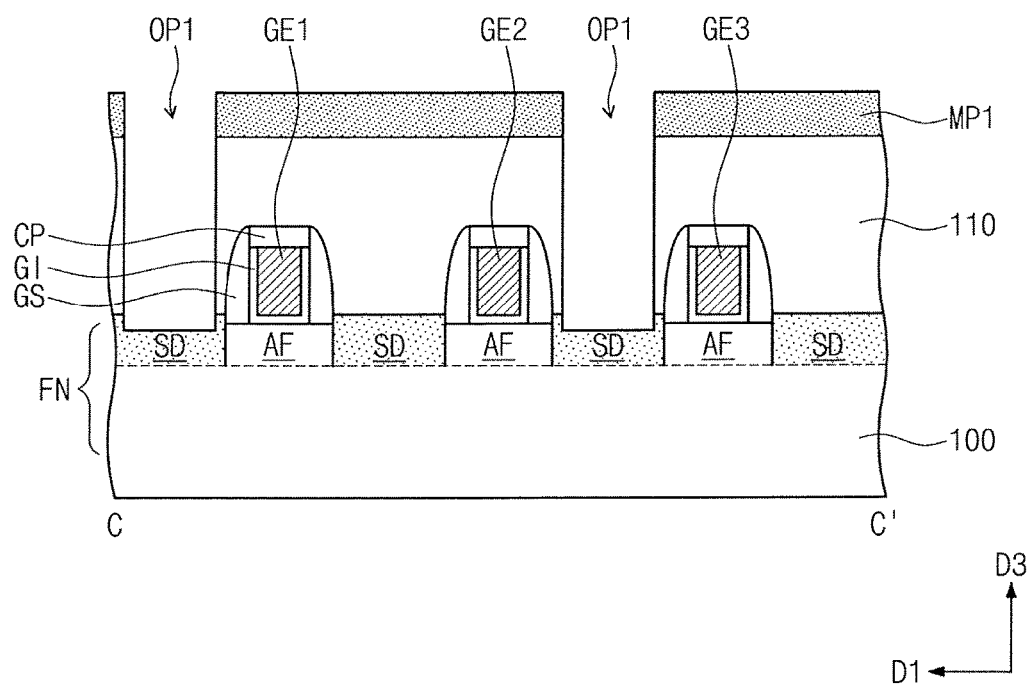
Figure 18:
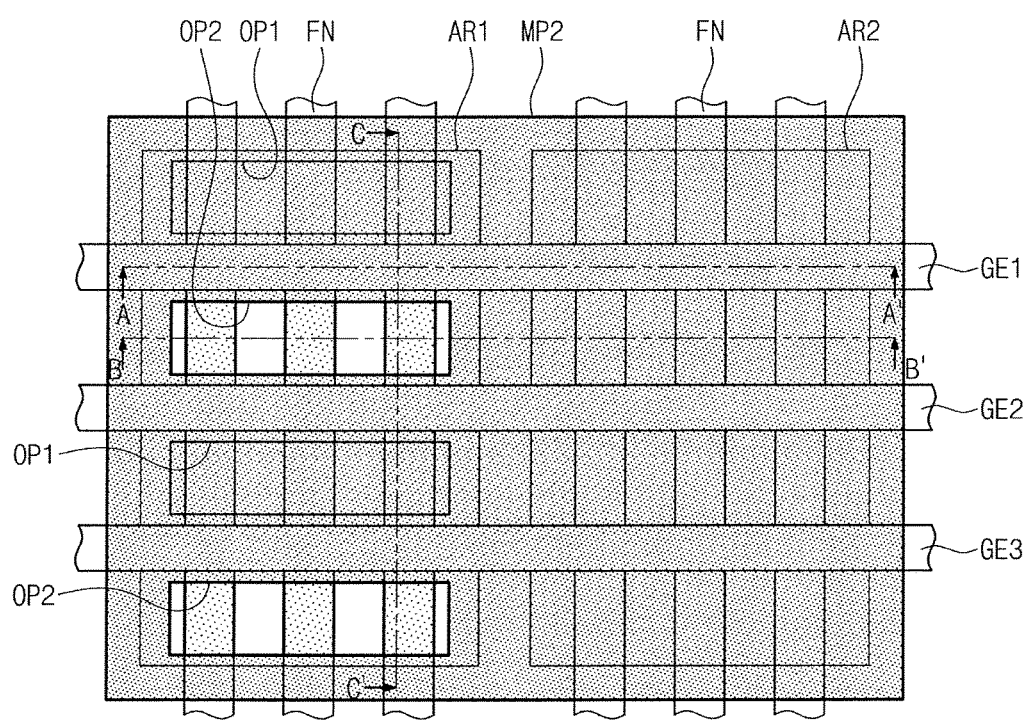
Figure 18:
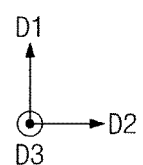
Figure 19A:
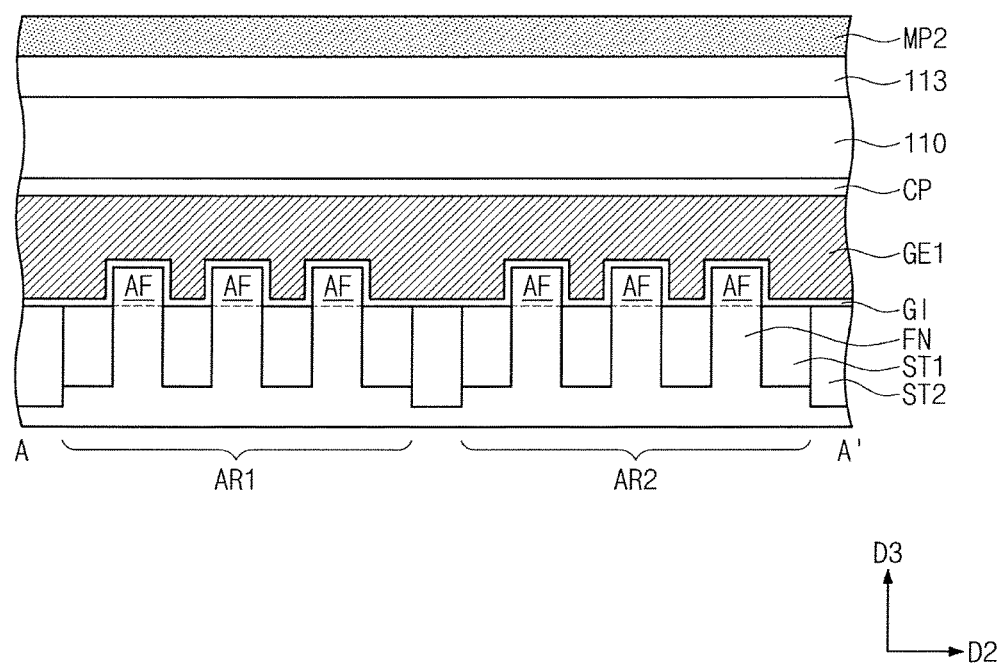
Figure 19B:
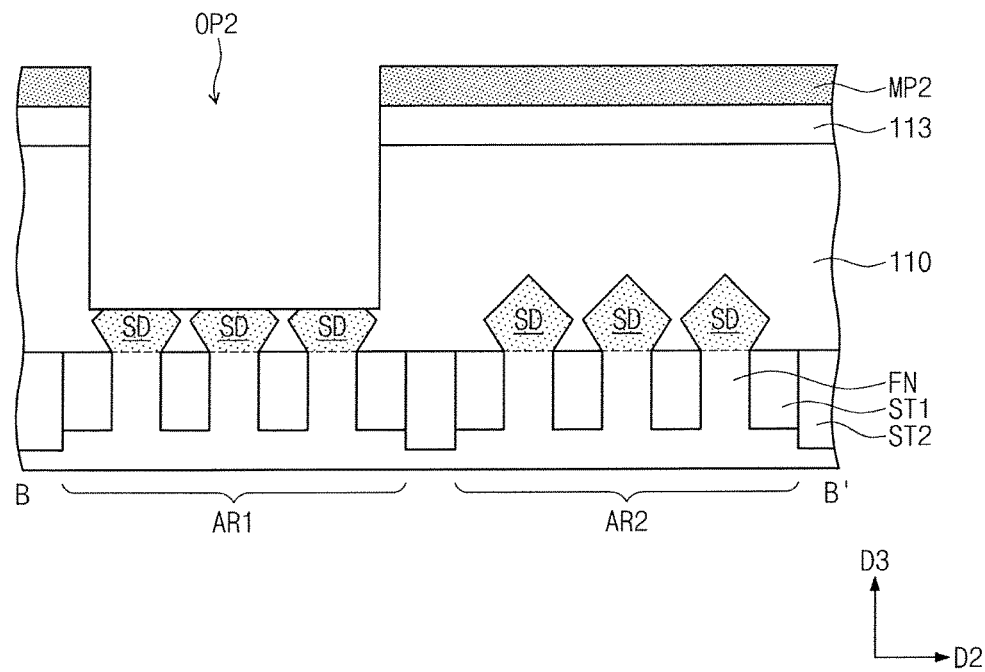
Figure 19C:
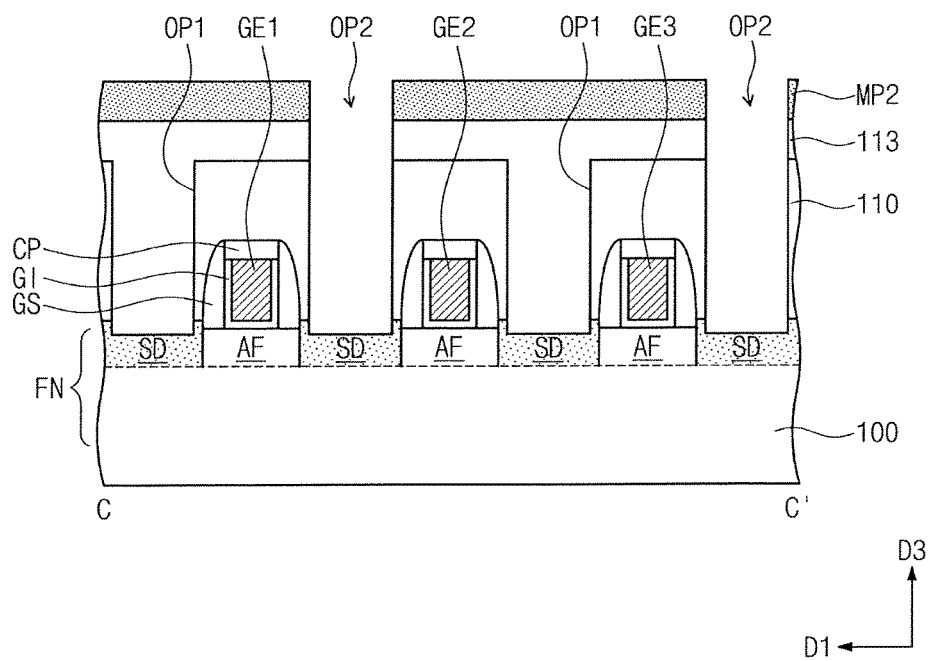

Referring to FIGS. 12, 13A, and 13B, a substrate 100 may be provided. The substrate 100 may include a first active region AR1 and a second active region AR2. For example, the substrate 100 may be a silicon substrate, a germanium substrate, or a Silicon-On-Insulator (SOI) substrate.

An upper portion of the substrate 100 may be patterned, for example, to form active patterns FN. The active patterns FN may extend in a first direction D1. First device isolation layers STI may be formed on the substrate 100. The first device isolation layers STI may fill spaces between the active patterns FN. The first device isolation layers ST1 may be recessed and may expose upper portions of the active patterns FN. A second device isolation layer ST2 may be formed on the substrate 100. The second device isolation layer ST2 may define a first active region AR1 and a second active region AR2. For example, when the second device isolation layer ST2 is formed, active patterns may be removed from regions other than the first and second active regions AR1 and AR2.

A Shallow Trench Isolation (STI) process may be performed, for example, to form the first and second device isolation layers ST1 and ST2. The first and second device isolation layers ST1 and ST2 may be formed using silicon oxide. For example, the first device isolation layers ST1 may be formed to have a depth less than a depth of the second device isolation layer ST2. As a result, the first device isolation layers ST1 may be formed by a separate process than a process used to form the second device isolation layer ST2. Alternatively, the first device isolation layers ST1 may be formed to have a depth substantially the same as a depth of the second device isolation layer ST2. As a result, the first device isolation layers ST1 may be formed simultaneously with the second device isolation layer ST2.

Referring to FIGS. 14, 15A, 15B, and 15C, gate electrodes GE1, GE2, and GE3 may be formed. The gate electrodes GE1 to GE3 may extend in a second direction D2. The gate electrodes GE1 to GE3 may cross the active patterns FN. The gate electrodes GE1 to GE3 may be spaced apart from each other in the first direction D1. The gate electrodes GE1 to GE3 may include a first gate electrode GE1, a second gate electrode GE2, and a third gate electrode GE3.

A gate dielectric pattern GI may be formed below each of the first to third gate electrodes GE1 to GE3. Gate spacers GS may be provided on opposite sides of each of the first to third gate electrodes GE1 to GE3. A capping pattern CP may be provided. The capping pattern CP may cover an upper surface of each of the first to third gate electrodes GE1 to GE3.

The formation of the first to third gate electrodes GE1 to GE3 may include forming first to third sacrificial patterns across the active patterns FN, forming the gate spacers GS on opposite sides of each of the first to third sacrificial patterns, and replacing the first to third sacrificial patterns with the first to third gate electrodes GE1 to GE3, respectively.

The first to third gate electrodes GE1 to GE3 may include at least one of a doped semiconductor, a metal, or a conductive metal nitride. The gate dielectric pattern GI may include a silicon oxide layer, a silicon oxynitride layer, or a high-k dielectric layer. A dielectric constant of the high-k dielectric layer may be greater than a dielectric constant of a silicon oxide layer. Each of the capping pattern CP and the gate spacers GS may include at least one of a silicon oxide layer, a silicon nitride layer, or a silicon oxynitride layer.

Source/drain regions SD may be formed at the upper portions of the active patterns FN. The source/drain regions SD may be formed on opposite sides of each of the first to third gate electrodes GE1 to GE3. When the PMOSFETs of FIG. 2 are included in a semiconductor device according to the present embodiment, the source/drain regions SD may be doped with p-type impurities. When the NMOSFETs of FIG. 1 are included in a semiconductor device according to the present embodiment, the source/drain regions SD may be doped with n-type impurities.

The source/drain regions SD may be epitaxial patterns. The epitaxial patterns may be formed by a selective epitaxial growth process. The active patterns FN on each of the first to third gate electrodes GE1 to GE3 may be partially recessed. An epitaxial growth process may be performed on the recessed regions of the active patterns FN. The epitaxial growth process may be performed using a semiconductor element different from a semiconductor element of the substrate 100. For example, the source/drain regions SD may be formed of a semiconductor element whose lattice constant is greater or less than a lattice constant of a semiconductor element of the substrate 100. As the source/drain regions SD are formed of a semiconductor element different from that of the substrate 100, a compressive or tensile stress may be provided to channel regions AF between the source/drain regions SD.

A first interlayer dielectric layer 110 may be formed to cover the source/drain regions SD and the first to third gate electrodes GE1 to GE3. The first interlayer dielectric layer 110 may include a silicon oxide layer or a silicon oxynitride layer.

Referring to FIGS. 16, 17A, 17B, and 17C, a first mask pattern MP1 may be formed on the first interlayer dielectric layer 110. The first mask pattern MP1 may include first openings OP1. The formation of the first mask pattern MP1 may include forming a first mask layer on the first interlayer dielectric layer 110; forming a first photoresist pattern on the first mask layer; and etching the first mask layer using the first photoresist pattern as an etch mask. The first photoresist pattern may be formed by a photolithography process using a first photomask.

The first mask pattern MP1 may be used as an etch mask to etch the first interlayer dielectric layer 110. The first openings OP1 may extend toward the substrate 100. Thus, portions of the source/drain regions SD may be exposed through the first openings OP1. When the first interlayer dielectric layer 110 is etched, exposed upper portions of the source/drain regions SD may also be etched.

Referring to FIGS. 18, 19A, 19B, and 19C, the first mask pattern MP1 may be removed. A first mold layer 115 filling the first openings OP1 may be formed on the first interlayer dielectric layer 110. The formation of the first mold layer 115 may include forming on the first interlayer dielectric layer 110 an insulation layer to fill the first openings OP1 and planarizing the insulation layer.

A second mask pattern MP2 may be formed on the first mold layer 115. The second mask pattern MP2 may include second openings OP2. The formation of the second mask pattern MP2 may include forming a second mask layer on the first mold layer 115, forming a second photoresist pattern on the second mask layer, and etching the second mask layer using the second photoresist pattern as an etch mask. The second photoresist pattern may be formed by a photolithography process using a second photomask.

The second mask pattern MP2 may be used as an etch mask to etch the first interlayer dielectric layer 110. The second openings OP2 may extend toward the substrate 100. Thus, portions of the source/drain regions SD may be exposed through the second openings OP2. When the first interlayer dielectric layer 110 is etched, exposed upper portions of the source/drain regions SD may also be etched.

Figure 20:
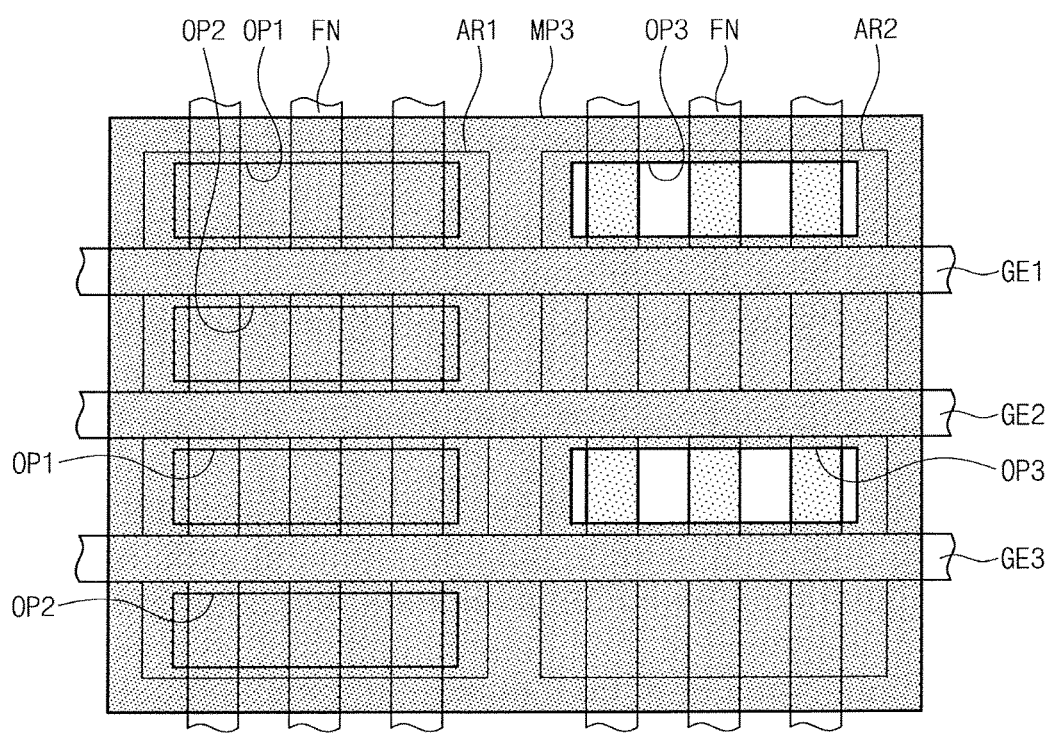
Figure 20:
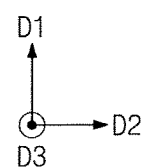

Referring to FIG. 20, the second mask pattern MP2 may be removed. A second mold layer may be formed on the first mold layer 115. The second mold layer may fill the second openings OP2. A third mask pattern MP3 may be formed on the second mold layer. The third mask pattern MP3 may include third openings OP3. The formation of the third mask pattern MP3 may be similar to the formation of the first or second mask pattern MP1 or MP2 discussed above. The third mask pattern MP3 may be used as an etch mask to etch the first interlayer dielectric layer 110. The third openings OP3 may extend toward the substrate 100. Thus, portions of the source/drain regions SD may be exposed through the third openings OP3.

Figure 21:
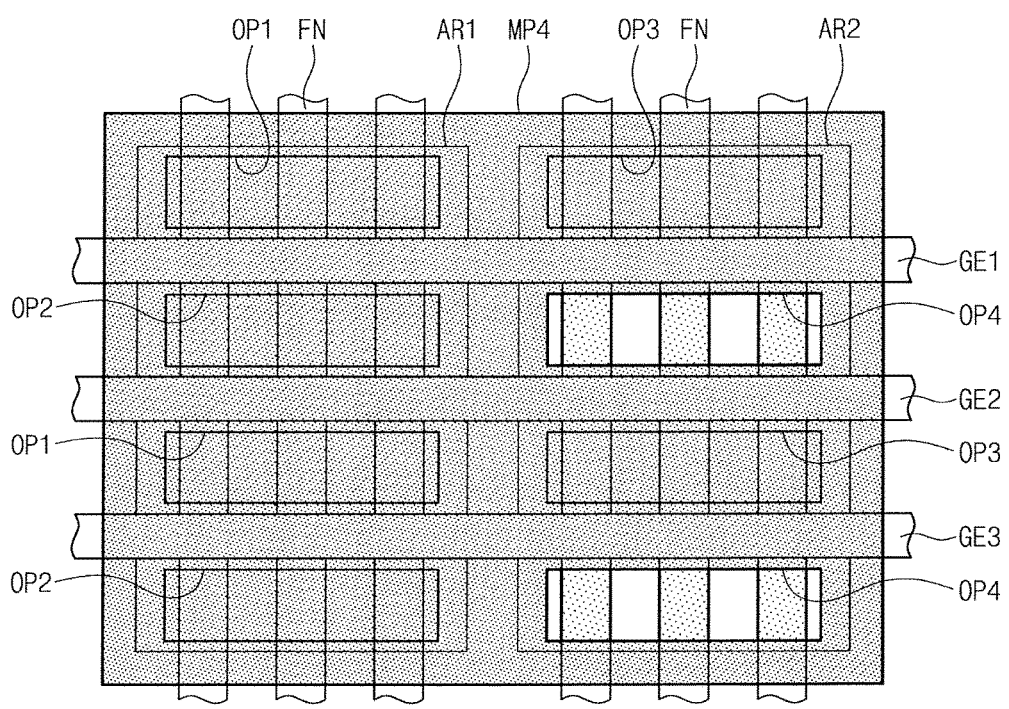
Figure 21:
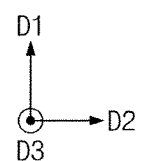
Figure 22:
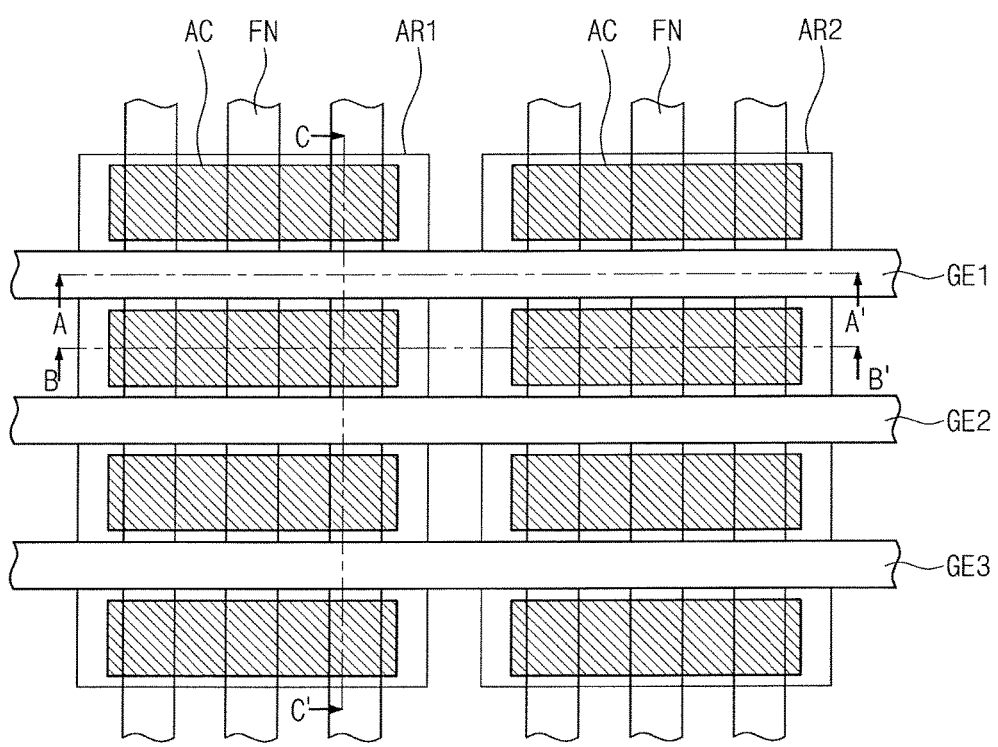
Figure 22:
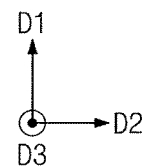
Figure 23A:
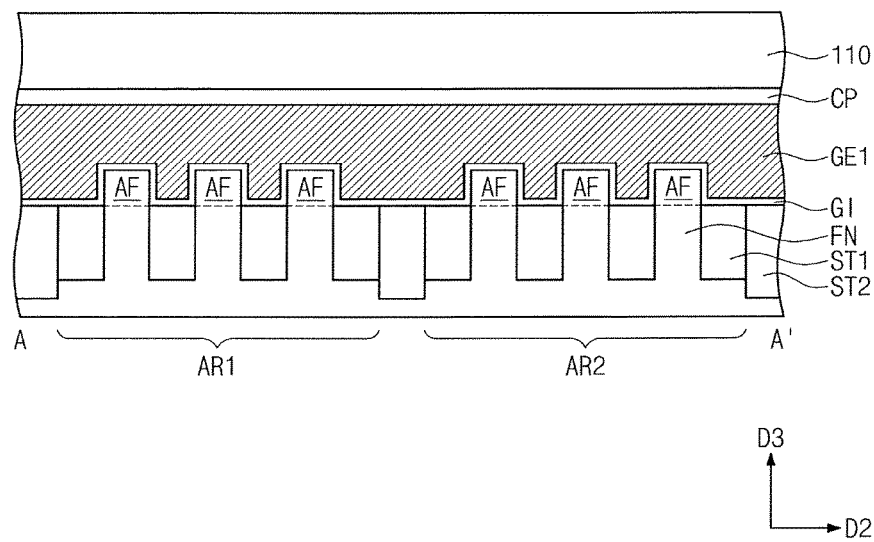
Figure 23B:
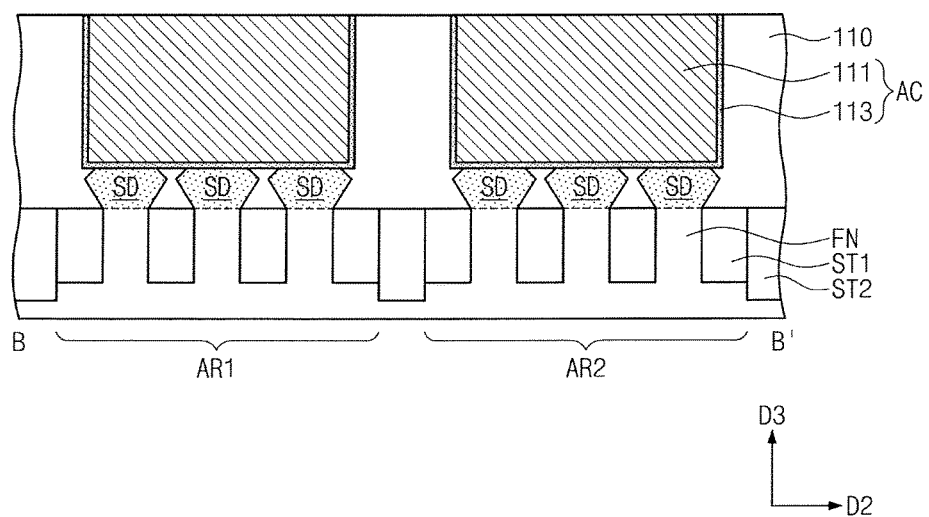
Figure 23C:
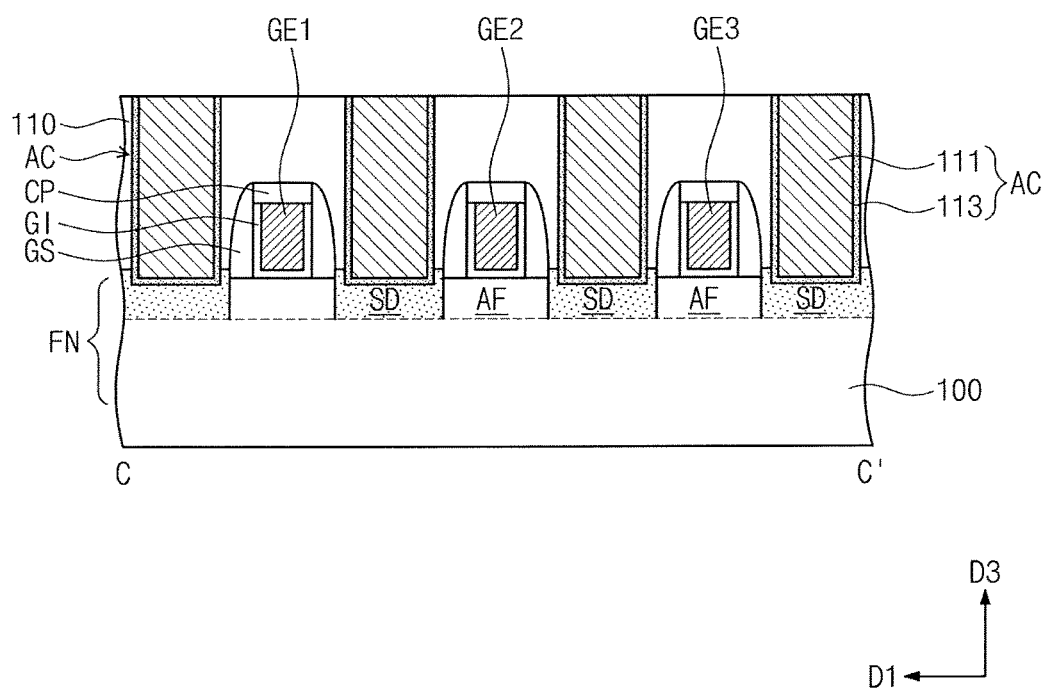
Figure 24:
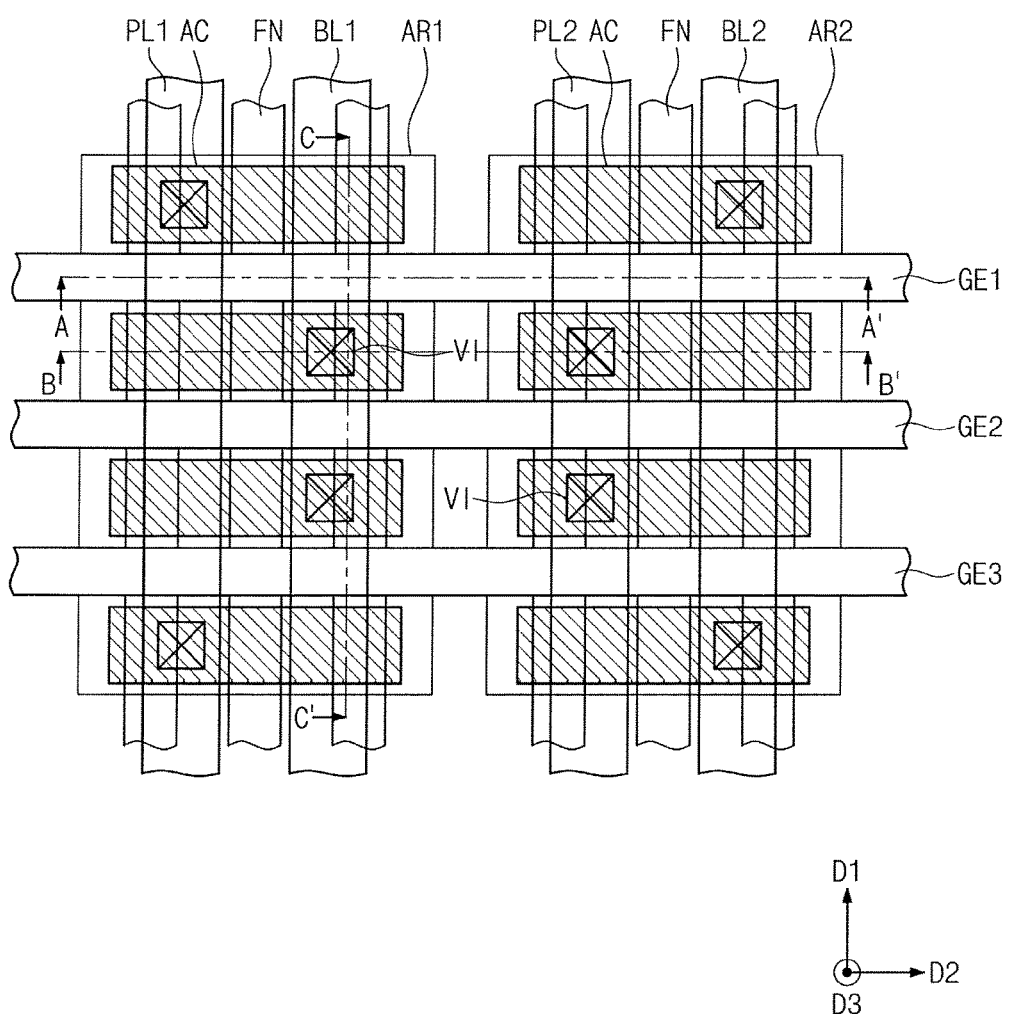
Figure 25A:
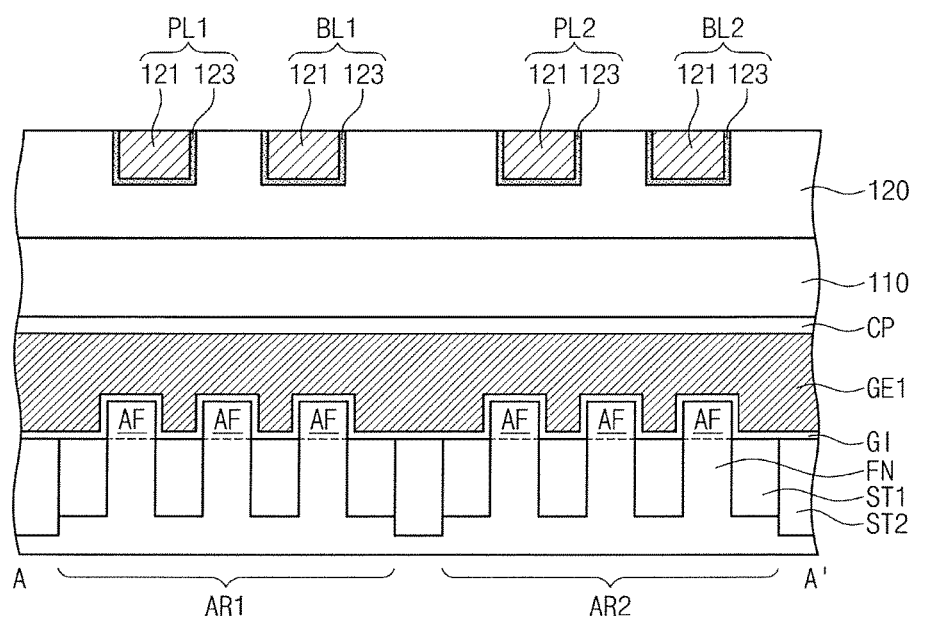
Figure 25B:
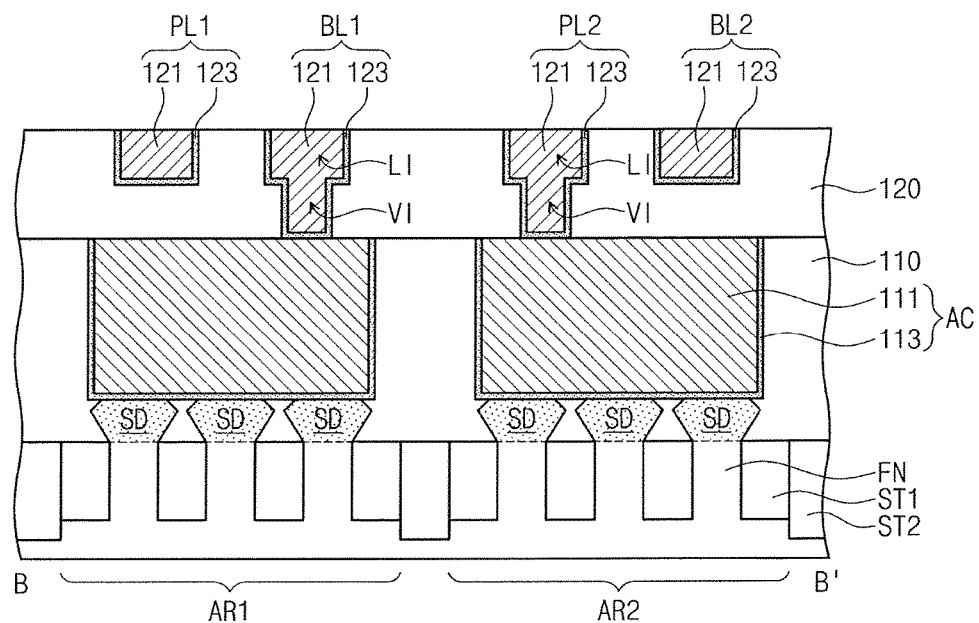
Figure 25B:
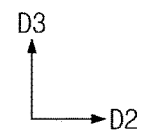
Figure 25C:
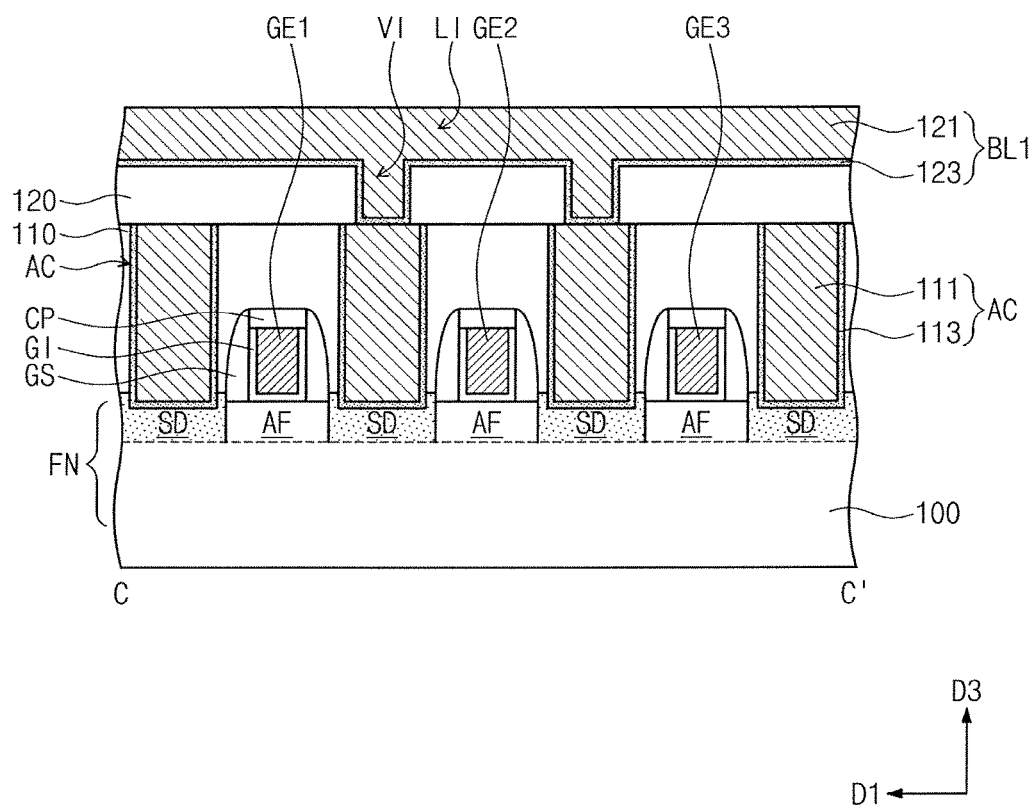

Referring to FIG. 21, the third mask pattern MP3 may be removed. A third mold layer may be formed on the second mold layer. The third mold layer may be formed on the second mold layer. A fourth mask pattern MP4 may be formed on the third mold layer. The fourth mask pattern MP4 may include fourth openings OP4. The formation of the fourth mask pattern MP4 may be similar to the formation of the first or second mask pattern MP1 or MP2 discussed above. The fourth mask pattern MP4 may be used as an etch mask to etch the first interlayer dielectric layer 110. The fourth openings OP4 may extend toward the substrate 100.

Thus, portions of the source/drain regions SD may be exposed through the fourth openings OP4.

Referring to FIGS. 22, 23A, 23B, and 23C, active contacts AC may be formed and may fill the first to fourth openings OP1 to OP4 formed in the first interlayer dielectric layer 110. The active contacts AC may be formed on the source/drain regions SD. The active contacts AC may extend in the second direction D2.

The formation of the active contact AC may include forming a first conductive pattern 111 and a first barrier pattern 113. A barrier layer may be conformally formed to partially fill the first to fourth openings OP1 to OP4. Subsequently, a conductive layer may be formed to fill the first to fourth openings OP1 to OP4. The conductive layer and the barrier layer may be planarized until an upper surface of the first interlayer dielectric layer 110 is exposed. As a result, the first conductive pattern 111 and the first barrier pattern 113 may be formed in the first to fourth openings OP1 to OP4. The conductive layer may include metal (e.g., aluminum, tungsten, or the like). The barrier layer may include conductive metal nitride (e.g., titanium nitride, tantalum nitride, or the like).

Referring to FIGS. 24, 25A, 25B, and 25C, a second interlayer dielectric layer 120 may be formed on the first interlayer dielectric layer 110. The second interlayer dielectric layer 120 may include a silicon oxide layer or a silicon oxynitride layer.

First and second power lines PL1 and PL2 and first and second bit lines BL1 and BL2 may be formed in the second interlayer dielectric layer 120. Each of the first and second power lines PL1 and PL2 and the first and second bit lines BL1 and BL2 may include a conductive line LI and a via VI. For example, a dual damascene process may be performed to form each of the first and second power lines PL1 and PL2 and the first and second bit lines BL1 and BL2. Through the dual damascene process, the conductive line LI and the via VI may integrally form a single conductor.

The formation of the first and second power lines PL1 and PL2 and the first and second bit lines BL1 and BL2 may include forming first and second power line holes; forming first and second bit line holes; and forming a barrier layer and a conductive layer. The barrier layer and the conductive layer may fill the first and second power line holes and the first and second bit line holes. The conductive layer may include a metal. The barrier layer may include conductive metal nitride. A fifth mask pattern may be used to form the first and second power line holes in the second interlayer dielectric layer 120. A sixth mask pattern may be used to form the first and second bit line holes in the second interlayer dielectric layer 120.

In a method of manufacturing a semiconductor device according to exemplary embodiments of the present inventive concept, different photomasks may be used to sequentially form the first to fourth openings OP1 to OP4. When, however, the first to fourth openings OP1 to OP4 are formed by a single photolithography process using one photomask, a spacing between the first to fourth openings OP1 to OP4 may be greater than a minimum spacing defined by a resolution limitation of the photolithography process. However, according to exemplary embodiments of the present inventive concept, since the first to fourth openings OP1 to OP4 are sequentially formed by using different photomasks, a relatively reduced spacing may be obtained between the first to fourth openings OP1 to OP4. This way, the active contacts AC having fine pitch may be produced by a method of manufacturing a semiconductor device according to exemplary embodiments of the present inventive concept.

In a semiconductor device according to exemplary embodiments of the present inventive concept, a substrate may be provided with memory cells disposed thereon that were produced by a single active contact layer and a single metal layer. Thus, an operation speed of the device may be increased, and a power consumption of the semiconductor device may be reduced. The semiconductor device according to exemplary embodiments the present inventive concept may have highly integrated memory cells. The semiconductor device according to exemplary embodiments of the present inventive concept may include active contacts having a fine pitch.

Although exemplary embodiments of the present inventive concept have been discussed with reference to accompanying figures, it will be understood that various changes in form and details may be made therein without departing from the spirit and scope of the present inventive concept. It therefore will be understood that the embodiments described above are illustrative but not limitative as defined by the following claims.

What is claimed is:

1. A substrate including a first active region;
A first, second and third active patters disposed on the first active region and extending in a first direction, wherein the second active pattern is disposed between the first and third active patterns;
a first gate electrode and a second gate electrode disposed on the first active region and extending in a second direction crossing the first direction;
a first power line and a first bit line disposed on the first active region, wherein the first power line and the first bit line extend in the first direction and parallel to each other;
first, second and third active contacts disposed on and in physical contact with the first active region extending in the second direction and overlapping the first active pattern, the second active pattern, the third active pattern the first power line and the first bit line,
wherein the first gate electrode is disposed between the first active contact and the second active contact, and the second gate electrode is disposed between the second active contact and the third active contact
a first via disposed on the first active contact and connected to the first power line, wherein the first via is the only via disposed on the first active contact;
a second via disposed an the second active contact and connected to the first bit line, wherein the second via is the only via disposed on the second active contact; and
a third via disposed on the third active contact and connected to the first bit line, wherein the third via is the only via disposed on the third active contact.

2. The semiconductor device of claim 1, wherein the first active pattern includes a first impurity region adjacent to a side of the first gate electrode, a second impurity region disposed between the first and second gate electrodes and a third impurity region adjacent to a side of the second gate electrode,
wherein the first gate electrode, the first impurity region and the second impurity region form a first transistor of a first memory cell, and the second gate electrode, the second impurity region, and the third impurity region form a second transistor of a second memory cell,
wherein when
the first transistor is turned on, the first memory cell is in an ON-state, and
the second memory cell is in an OFF-state.

3. The semiconductor device of claim 1, wherein the substrate further includes a second active region, and the first and second gate electrodes are disposed on the second active region while extending from the first active region toward the second active region, wherein the semiconductor device further comprises:
   Fourth fifth and sixth active patterns disposed on the second active region and extending in the first direction, wherein the fifth active pattern is disposed between the fourth and sixth active patterns;
   A second power line and a second bit line disposed on the second active region wherein the second power line and the second bit line extend in the first direction and parallel to each other;
   fourth, fifth and sixth active contacts disposed on and in physical contact with the second active region extending in the second direction and overlapping the fourth active patent, the fifth active pattern, the sixth active pattern, the second power line and the second bit line,
   wherein the first gate electrode is disposed between the fourth active contact and the fifth active contact and the second gate is disposed between the fifth active contact and the sixth active contact;
   a forth via disposed on the fourth active contact and connected to the second bit line,
   wherein the fourth via is the only via disposed on the fourth active contact,
   a fifth via disposed on the fifth active contact and connected to the second power line, wherein the fifth via is disposed on the fifth active contact and s
   a sixth via disposed on the sixth active contact and connected to the second power line, wherein the sixth via is the only via disposed on the sixth active contact.

4. The semiconductor device of claim 1, further comprising a device isolation layer disposed at an upper portion of the substrate,
   wherein the device isolation layer defines the first, second and third active patterns, and
   wherein an upper portion of each of the first, second and third active patterns vertically protrudes from the device isolation layer.

5. The semiconductor device of claim 2, wherein each of the first and second memory cells is a Read Only Memory (ROM) cell.

6. A semiconductor device, comprising:
   a substrate having an active pattern and a first semiconductor element;
   a gate electrode disposed on the active pattern, the gate electrode disposed on an upper surface and opposite sidewalls of the active pattern;
   a first source/drain region and a second source/drain region disposed at an upper portion of the active pattern, the gate electrode disposed between the first and second source/drain regions;
   first and second active contacts disposed on and connected to the first and second source/drain regions, respectively;
   a first via disposed on the first active contact and a second via disposed on the second active contact, wherein the first via is not disposed on the second active contact and the second via is not disposed on the first active contact; and
   a first power line and a first bit line disposed on the first and second active contacts,
   wherein the active pattern and the gate electrode form a transistor of a memory cell,
   wherein at least one of the first and second vias is connected to the first power line or the first bit line,
   wherein the first and second source/drain regions comprise a second semiconductor element having a lattice constant greater than a lattice constant of the first semiconductor element of the substrate, and
   wherein the second semiconductor element is different from the first semiconductor element.

7. The semiconductor device of claim 6, wherein the first and second active contacts are in direct contact with the first and second source/drain regions.

8. The semiconductor device of claim 6, wherein
   the first and second active contacts extend in a first direction, and
   the first power line and the first bit line extend in a second direction crossing the first direction.

9. The semiconductor device of claim 6, wherein the memory cell is a Read Only Memory (ROM) cell.

10. The semiconductor device of claim 6, wherein the first and second source/drain regions have p-type conductivity.

11. The semiconductor device of claim 6, wherein
   the first via is connected to the first power line,
   the second via is connected to the first bit line, and
   when the transistor is turned on, the memory cell is in an ON-state.

12. The semiconductor device of claim 6, wherein when both of
   the first and second vias are connected to the first power line or the first bit line,
   the memory cell is in an OFF-state.

13. The semiconductor device of claim 6, further comprising:
   a second power line disposed on and electrically connected to the first power line; and
   a second bit line disposed on and electrically connected to the first bit line,
   wherein the first and second power lines overlap each other, and
   wherein the first and second bit lines overlap each other.

14. The semiconductor device of claim 6, wherein
   a width of the first power line is greater than a width of the first bit line, and
   a width of the first via is greater than a width of the second via.

15. A semiconductor device, comprising:
   a substrate having a first active pattern, a second active pattern and a third active pattern extending in a first direction, wherein the first active pattern includes a first source/drain region, a second source/drain region and a channel region;
   a gate electrode disposed on the first active pattern between the first and second source/drain regions;
   first and second active contacts disposed on and connected to the first and second source/drain regions, respectively, wherein the first and second active contacts extend in a second direction crossing the first direction, and overlap the first active pattern, the second active pattern, and the third active pattern;
   a first via disposed on the first active contact and a second via disposed on the second active contact, wherein the first via is the only via disposed on the first active contact, and the second via is the only via disposed on the second active contact; and
   a power line and a bit line disposed on each of the first and second active contacts,
   wherein the active pattern and the gate electrode form a transistor of a memory cell, and wherein the first and second vias are connected to the bit line, and wherein the memory cell is in an OFF-state.

16. The semiconductor device of claim 15, wherein the gate electrode is disposed on and overlaps the channel region.

17. The semiconductor device of claim 15, wherein the gate electrode includes at least one of a doped semiconductor, a conductive metal nitride, or a metal.

18. The semiconductor device of claim 15, wherein the first and second active contacts are spaced apart from the gate electrode, and an upper surface of each of the first and second active contacts is higher than an upper surface of the gate electrode.

19. The semiconductor device of claim 15, wherein the power line and the bit line each include at least one of a conductive metal nitride or a metal.

* * * * *